US011612091B2

United States Patent
Higashino

(10) Patent No.: US 11,612,091 B2
(45) Date of Patent: Mar. 21, 2023

(54) FEEDER MANAGEMENT DEVICE AND COMPONENT-MOUNTING SYSTEM PROVIDED WITH SAME

(71) Applicant: YAMAHA HATSUDOKI KABUSHIKI KAISHA, Iwata (JP)

(72) Inventor: Masaki Higashino, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 366 days.

(21) Appl. No.: 16/758,028

(22) PCT Filed: Oct. 31, 2017

(86) PCT No.: PCT/JP2017/039312
§ 371 (c)(1),
(2) Date: Apr. 21, 2020

(87) PCT Pub. No.: WO2019/087293
PCT Pub. Date: May 9, 2019

(65) Prior Publication Data
US 2020/0323115 A1 Oct. 8, 2020

(51) Int. Cl.
*G06F 7/00* (2006.01)
*H05K 13/08* (2006.01)
(Continued)

(52) U.S. Cl.
CPC ..... *H05K 13/086* (2018.08); *G05B 19/41865* (2013.01); *H05K 13/0419* (2018.08);
(Continued)

(58) Field of Classification Search
CPC ............ H05K 13/086; H05K 13/0419; H05K 13/085; H05K 13/0417; G05B 19/41865; G05B 2219/36195; G05B 2219/45026
(Continued)

(56) References Cited

U.S. PATENT DOCUMENTS

2009/0062951 A1 3/2009 Awata
2013/0025118 A1 1/2013 Miyake
(Continued)

FOREIGN PATENT DOCUMENTS

CN 102651964 A 8/2012
CN 105474769 A 4/2016
(Continued)

OTHER PUBLICATIONS

An Office Action issued by the China National Intellectual Property Administration dated Dec. 3, 2020, which corresponds to Chinese Application No. 201780096136.9 and is related to U.S. Appl. No. 16/758,028 with Partial English language translation.
(Continued)

*Primary Examiner* — Yolanda R Cumbess
(74) *Attorney, Agent, or Firm* — Studebaker & Brackett PC

(57) ABSTRACT

A tape feeder management device includes a feeder classifying unit and a feeder arrangement setting unit. The feeder classifying unit classifies a plurality of tape feeders into a plurality of types of tape feeders. The feeder arrangement setting unit sets arrangement of the plurality of tape feeders in a component feeding unit, according to classification of the tape feeders made by the feeder classifying unit. The feeder arrangement setting unit includes a first setting unit. The first setting unit extracts a special type feeder classified as a tape feeder of a special type by the feeder classifying unit, and sets arrangement of the plurality of tape feeders such that a given reference number or more of the special type feeders are arranged consecutively in a row in an area of the component feeding unit, the area being defined by at least excluding both ends of the component feeding unit.

20 Claims, 15 Drawing Sheets

(51) Int. Cl.
*H05K 13/04* (2006.01)
*G05B 19/418* (2006.01)

(52) U.S. Cl.
CPC ............. *G05B 2219/36195* (2013.01); *G05B 2219/45026* (2013.01)

(58) Field of Classification Search
USPC .......................................... 700/90, 99, 213
See application file for complete search history.

(56) References Cited

U.S. PATENT DOCUMENTS

| | | |
|---|---|---|
| 2016/0212897 A1 | 7/2016 | Tsuge et al. |
| 2016/0212900 A1 | 7/2016 | Nagata et al. |
| 2017/0061365 A1 | 3/2017 | Nonoyama |
| 2018/0046736 A1 | 2/2018 | Sugimoto et al. |
| 2018/0049354 A1 | 2/2018 | Honda et al. |
| 2018/0064005 A1 | 3/2018 | Iisaka |
| 2018/0332746 A1* | 11/2018 | Fukaya .............. H05K 13/0885 |
| 2019/0191603 A1 | 6/2019 | Honda et al. |

FOREIGN PATENT DOCUMENTS

| | | |
|---|---|---|
| CN | 105612825 A | 5/2016 |
| CN | 106233827 A | 12/2016 |
| CN | 107211565 A | 9/2017 |
| JP | 2000-223889 A | 8/2000 |
| JP | 2002-134994 A | 5/2002 |
| JP | 2005-216945 A | 8/2005 |
| JP | 2007-043085 A | 2/2007 |
| JP | 2011-129599 A | 6/2011 |
| JP | 2017-045744 A | 3/2017 |
| WO | 2016-142988 A1 | 9/2016 |
| WO | 2016-142989 A1 | 9/2016 |
| WO | 2016/181497 A1 | 11/2016 |

OTHER PUBLICATIONS

International Search Report issued in PCT/JP2017/039312; dated Jan. 9, 2018.

\* cited by examiner

# FEEDER MANAGEMENT DEVICE AND COMPONENT-MOUNTING SYSTEM PROVIDED WITH SAME

CROSS-REFERENCE TO RELATED APPLICATION

This application is a National Stage of International Patent Application No. PCT/JP2017/039312, filed Oct. 31, 2017, the entire content of which is incorporated herein by reference.

BACKGROUND

Technical Field

The present disclosure relates to a feeder management device that manages arrangement of a plurality of tape feeders in a component feeding unit of a component-mounting device, and a component-mounting system provided with the feeder management device.

Background Art

A component-mounting device having tape feeders is known as a component-mounting device that mounts (packages) electronic components (hereinafter simply referred to as "components") on a board, such as printed wiring board, to produce a component-mounting board. A tape feeder intermittently sends off a component storage tape carrying components, from a reel wound with the component storage tape, to transfer the components to a given component take-out position. In a component feeding unit of the component-mounting device, a plurality of tape feeders are arranged in a row, and components fed by the tape feeders are picked by a holder of a component mounting head and are mounted on the board, as described, for example, in JP 2011-129599 A.

For production of the component-mounting board by the component-mounting device, an operator carries out pre-arrangement work, such as attaching a tape feeder fitted with a component storage tape needed for the production to the component feeding unit of the component-mounting device, based on a component-mounting board production plan, and thereafter the production starts. During production of the component-mounting board, to avoid such a case that production of the component-mounting board stops because of suspension of component supply from the tape feeder, the operator carries out component supply work of fitting a new component storage tape for replenishment to the tape feeder in accordance with an amount of components consumed for production of the component-mounting board.

In the component feeding unit of the component-mounting device, the tape feeder is set at each set position defined for each component. Arrangement of tape feeders each set at each set position in the component feeding unit is usually determined by taking account of a relationship between the size of the holder of the component mounting head and the size of a component and of the number of components mounted on the component-mounting board to be produced, so that the efficiency of production of the component-mounting board is improved.

Meanwhile, there are various tape feeders different in shape and in method of supplying the component storage tape. For example, tape feeders vary in shape, thus including various tape feeders different in length in their longitudinal direction along a direction feeding the component storage tape. Tape feeders vary also in method of supplying the component storage tape, thus including tape feeders operating according to a splicing tape supply method and tape feeders operating according to splicingless tape supply method (autoloading tape supply method).

In the case of a tape feeder operating according to the splicing tape supply method, when a preceding component storage tape, which feeds components first, comes to have a little portion left to send off, the operator carries out component supply work of splicing a component storage tape for replenishment to a rear end of the preceding component storage tape. In the case of a tape feeder operating according to the autoloading tape supply method, in contrast, when a front end of the tape is set at a given position in advance, the tape can be automatically loaded onto the component take-out position by operating a button. If a front end of the component storage tape for replenishment is set at the given position in advance, the component storage tape for replenishment is automatically loaded onto the component take-out position after the preceding component storage tape is entirely sent off. Thus, the component storage tape for replenishment starts its intermittent send-off action. In this manner, the tape feeder operating according to the autoloading tape supply method spares the operator cumbersome tape charging work or tape splicing work, thus improving the efficiency of so-called tape feeder pre-arrangement work and component supply work.

In a state in which, as described above, various tape feeders different in shape and in method of supplying the component storage tape are present together, if arrangement of tape feeders in the component feeding unit of the component-mounting device is determined to be ordinary arrangement that gives priority to the efficiency of production of the component-mounting board, it may lead to impairment of the smoothness of tape feeder pre-arrangement work and component supply work. In such a case, a delay in pre-arrangement work and component supply work causes component feeding from the tape feeder to stop, raising a concern that the efficiency of production of the component-mounting board does not improve but rather drops.

SUMMARY

The present disclosure has been conceived in view of the above circumstances, and therefore provides a feeder management device that in a state in which various tape feeders different in shape and in method of supplying a component storage tape are present together, manages arrangement of tape feeders, the arrangement allowing an operator to smoothly carry out pre-arrangement work and component supply work, and to provide a component-mounting system provided with the feeder management device.

A feeder management device according to one aspect of the present disclosure is a device that manages arrangement of a plurality of tape feeders in a component feeding unit, the plurality of tape feeders being arranged in a row in the component feeding unit of a component-mounting device that mounts components on a board to produce a component-mounting board and feeding a component storage tape carrying components to feed the components. The feeder management device includes a feeder classifying unit that classifies the plurality of tape feeders into a plurality of types of tape feeders, based on a classification index on a shape or on a method of supplying the component storage tape, the classification index serving as an index for classifying the plurality of tape feeders; an input unit that receives input of an instruction on setting of arrangement of the plurality of tape feeders; and a feeder arrangement setting unit that, referring to the instruction input to the input unit, sets arrangement of the plurality of tape feeders according to classification made by the feeder classifying unit. The feeder arrangement setting unit includes a first setting unit that extracts a special type feeder classified as a tape feeder of a special type by the feeder classifying unit and that sets arrangement of the plurality of tape feeders such that a given reference number or more of the special type feeders are arranged consecutively in a row in an area of the component feeding unit, the area being defined by at least excluding both ends of the component feeding unit in a direction of the arrangement in a row.

A component-mounting system according to another aspect of the present disclosure includes a component-mounting device having a component feeding unit in which a plurality of tape feeders are arranged in a row; and the above feeder management device that manages arrangement of the plurality of tape feeders in the component feeding unit.

The object, features, and advantages of the present disclosure will be clarified through the following detailed description and reference to the accompanying drawings.

DETAILED DESCRIPTION

A feeder management device and a component-mounting system according to an embodiment of the present disclosure will now be described with reference to drawings.

[Overall Configuration of Component-Mounting System]

Figure 1:
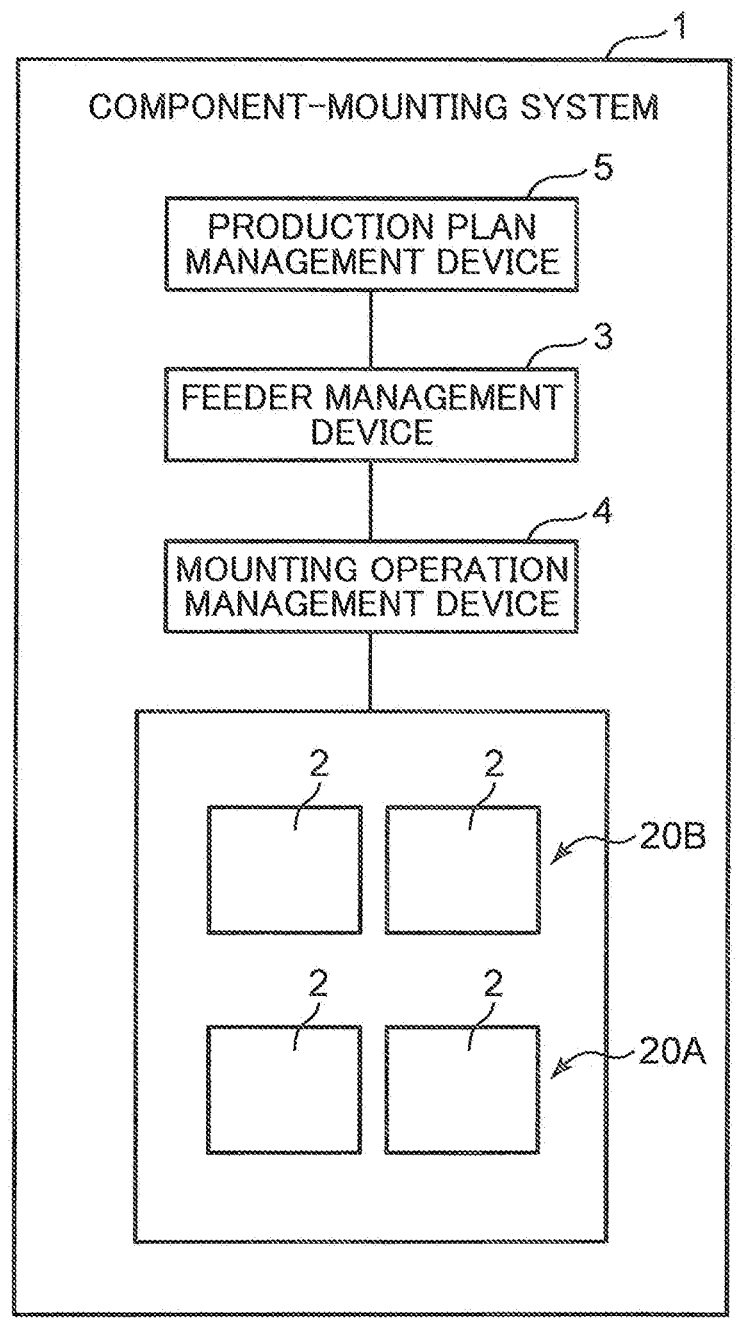
FIG. 1 is a schematic view of a configuration of a component-mounting system including a feeder management device according to a first embodiment of the present disclosure.

FIG. 1 is a schematic view of a configuration of a component-mounting system 1 according to one embodiment of the present disclosure. The component-mounting system 1 includes component-mounting devices 2, a feeder management device 3, a mounting operation management device 4, and a production plan management device 5. In the component-mounting system 1, the mounting operation management device 4 and the production plan management device 5 are management devices that are connected to the feeder management device 3 in such a way as to carry out data communication with the management device 3 and that manage production of component-mounting boards by the component-mounting devices 2. The component-mounting system 1 includes a plurality of production lines 20A and 20B on each of which a plurality of component-mounting devices 2 are arranged in a row. In an example shown in FIG. 1, the component-mounting system 1 includes two production lines 20A and 20B on each of which two component-mounting devices 2 are arranged in a row.

<Configuration of Component-Mounting Device>

Figure 2:
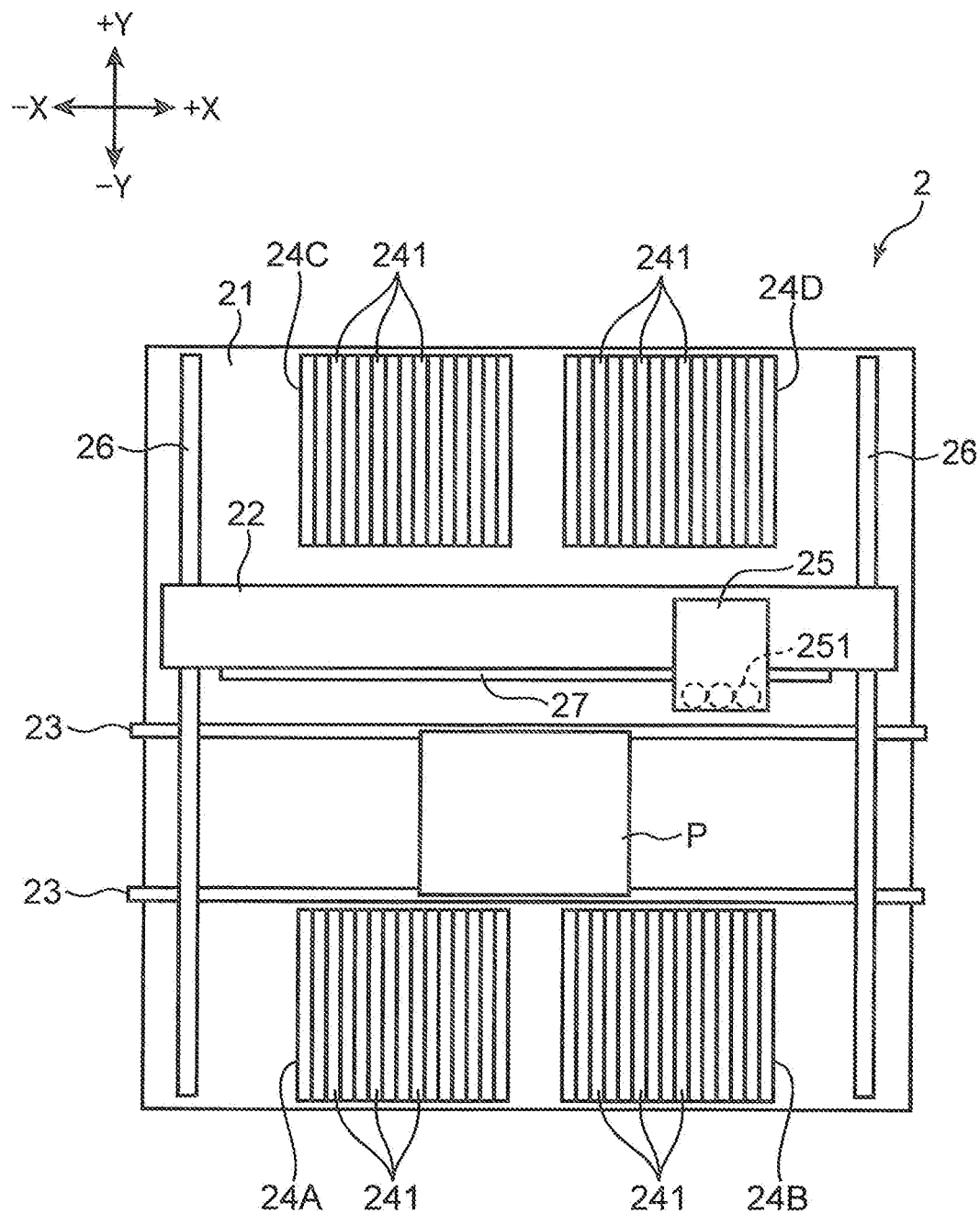
FIG. 2 is a plan view of a configuration of a component-mounting device included in the component-mounting system.

A configuration of the component-mounting device 2 will first be described with reference to FIG. 2. FIG. 2 is a plan view of the configuration of the component-mounting device 2. In the following description, directional relationships will be described using the X and Y rectangular coordinate axes. One side of the X-axis direction is referred to as "+X-side", and the other side of the same that is opposite to the one side is referred to as "−X-side". One side of the Y-axis direction is referred to as "+Y-side", and the other side of the same that is opposite to the one side is referred to as "−Y-side".

The component-mounting device 2 is a device that mounts components on a board P to produce a component-mounting board. The component-mounting device 2 includes a body frame 21, a mobile frame 22, conveyors 23, component feeding units 24A, 24B, 24C, and 24D, a head unit 25, first drive mechanisms 26, and a second drive mechanism 27.

The body frame 2 is a structure in which units making up the component-mounting device 2 are arranged. The body frame 2 is formed into a substantially rectangular shape in a plan view in a direction perpendicular to the X-axis direction and the Y-axis direction. The conveyors 23 extend in the X-axis direction and are arranged in the body frame 21. The conveyors 23 transfer the board P in the X-axis direction. The board P on the conveyors 23 is transferred by the conveyors 23 to a given work location (component mounting location where a component is mounted on the board P), where the board P is positioned.

The component feeding units 24A, 24B, 24C, and 24D are arranged respectively in four locations in the body frame 21 such that a pair of them are arranged in a row in the X-axis direction in an area on the +Y-side in the Y-axis direction while the other pair of them are arranged in a row in the X-axis direction in an area on the −Y-side in the Y-axis direction. In FIG. 2, the component feeding unit located on the −X-side in the area on the −Y-side in the Y-axis direction of the body frame 21 is indicated as "component feeding unit 24A" while the component feeding unit located on the +X-side in the same area is indicated as "component feeding unit 24B". Likewise, the component feeding unit located on the −X-side in the area on the +Y-side in the Y-axis direction is indicated as "component feeding unit 24C" while the component feeding unit located on the +X-side in the same area is indicated as "component feeding unit 24D". In the body frame 21, the component feeding units 24A, 24B, 24C, and 24D serve as areas in which a plurality of tape feeders 241 arranged in a row are fitted. In each of the component feeding units 24A, 24B, 24C, and 24D, a set position of each tape feeder 241 is defined for each component to be sucked and held by a suction nozzle 251 that is a holder attached to a head unit 25, which will be described later.

The tape feeder 241 is a feeder configured such that a component storage tape carrying components stored at given intervals is wound around a reel and is sent off from the reel. The tape feeder 241 is fitted removably to the component feeding units 24A, 24B, 24C, and 24D of the body frame 21, and sends off the component storage tape, thereby feeding components stored in the component storage tape to the suction nozzle 251 of the head unit 25.

The tape feeders 241 arranged in a row in the component feeding units 24A, 24B, 24C, and 24D of the component-mounting device 2 are various tape feeders different in shape and in method of supplying the component storage tape. For example, the tape feeders 241 vary in shape. Thus, some tape feeders 241 use component storage tapes having the same width but having different lengths. In the following description, in the plurality of tape feeders 241 arranged in a row in the component feeding units 24A, 24B, 24C, and 24D, tape feeders 241 different in longitudinal length are distinguished from each other by classifying them into "tape feeders having a first longitudinal length" and "tape feeders having a second longitudinal length", which is shorter than the first longitudinal length.

The tape feeders 241 vary also in method of supplying the component storage tape, thus including tape feeders 241 that operate according to a first supply method, i.e., autoloading tape supply method and tape feeders 241 that operate according to a second supply method, i.e., splicing tape supply method.

A tape feeder which operates according to the first supply method, i.e., the autoloading tape supply method, is configured to be fitted with a plurality of component storage tapes, which are a preceding component storage tape that feeds components first and a component storage tape for replenishment that feeds components following completion of component feeding by the preceding component storage tape. More specifically, the tape feeder operating according to the first supply method is configured to be fitted with a plurality of reels wound with component storage tapes, respectively, and is provided with a tape guide 244 having a component feeding opening, which defines a component feeding position for feeding a component to the suction nozzle 251, and a component exposing portion. This tape guide 244 will be described later. According to the tape feeder operating according to the first supply method, when the preceding component storage tape is completely sent off from the reel, the component storage tape for replenishment is automatically sent off from the reel. Because a plurality of reels can be fitted to the tape feeder operating according to the first supply method, a point of time of supplying the reel wound with the component storage tape for replenishment is not limited to a point of time at which the preceding component storage tape is sent off completely from the reel around which the preceding component storage tape has been wound, but is given a degree of freedom. The tape feeder operating according to the first supply method thus saves an operator cumbersome tape charging work or tape splicing work, allowing an improvement in the efficiency of so-called tape feeder pre-arrangement work and component supply work. In the following description, the tape feeder operating according to the first supply method, i.e., autoloading tape supply method (autoloading tape feeder or ALF) will be referred to as "first tape feeder 241". This first tape feeder 241 will be described in detail later.

The tape feeder operating according to the second supply method, i.e., splicing tape supply method, on the other hand, is configured to be fitted with one reel. According to the tape feeder operating according to the second supply method, at a point of time at which a preceding component storage tape is sent off completely from the one reel fitted to the tape feeder, transition from the preceding component storage tape to a component storage tape for replenishment is performed. For this reason, a rear end of the preceding component storage tape is spliced to a front end of the component storage tape for replenishment by pasting a splicing tape or the like on a part where both ends join. According to the tape feeder operating according to the second supply method, at a point of time at which the preceding component storage tape is sent off completely from the one reel, splicing work of pasting the splicing tape or the like is carried out. A point of time of supplying a reel wound with the component storage tape for replenishment is, therefore, limited to the point of time at which the preceding component storage tape is sent off completely. In the following description, the tape feeder operating according to the second supply method, i.e., splicing tape supply method will be referred to as "second tape feeder 241A; non-ALF" in order to distinguish the tape feeder operating according to the splicing tape supply method from the first tape feeder 241 that is an ALF.

When component storage tapes having the same width are used respectively by the first tape feeder 241 operating according to the first supply method and the second tape feeder 241A operating according to the second supply method, the longitudinal length of the second tape feeder 241A is determined to be shorter than that of the first tape feeder 241. In other words, when the first tape feeder 241 operating according to the first supply method and the second tape feeder 241A operating according to the second supply method are classified by paying attention to their longitudinal lengths, the first tape feeder 241 is classified as "tape feeder having the first longitudinal length" while the second tape feeder 241A is classified as "tape feeder having the second longitudinal length".

The mobile frame 22 of the component-mounting device 2 extends in the X-axis direction, and is supported by the body frame 21 such that the mobile frame 22 is allowed to move in a given direction (Y-axis direction). The mobile frame 22 carries the head unit 25. The head unit 25 is mounted on the mobile frame 22 such that the head unit 25 is allowed to move in the X-axis direction. In other words, the head unit 25 can be moved in the Y-axis direction as a result of movement of the mobile frame 22 in the Y-axis direction and can independently move in the X-axis direction along the mobile frame 22. The head unit 25 can move between each of tape feeders 241 (241A) arranged in a row in the component feeding units 24A, 24B, 24C, and 24D and the given work location to which the board P is transferred by the conveyors 23. The head unit 25 takes out a component from the tape feeder and mounts (packages) the taken out component on the board P.

The head unit 25 has the suction nozzle 251, which is a holder capable of sucking and holding the component to be mounted on the board P. The suction nozzle 251 can communicate with any one of a negative pressure generation device, a positive pressure generation device, and the fresh air, via an electric selector valve. Specifically, supplying a negative pressure to the suction nozzle 251 allows it to suck and hold the component (to take out the component). Afterward, supplying a positive pressure to the suction nozzle 251 causes it to release the component. According to this embodiment, a holder different from the suction nozzle 251 may be adopted. For example, a chuck that grips and holds a component may be used in place of the suction nozzle 251.

The first drive mechanisms 26 of the component-mounting device 2 are disposed on a +X-side end and a −X-side end of the body frame 21, respectively. The first drive mechanisms 26 are mechanisms that move the mobile frame 22 in the Y-axis direction. Each of the first drive mechanisms 26 includes, for example, a drive motor, a ball screw shaft extending in the Y-axis direction and connected to the drive motor, and a ball nut disposed on the mobile frame 22 and screwed on the ball screw shaft. According to the first drive mechanism 26 configured in this manner, as a result of the rotation of the ball screw shaft caused by the drive motor, the ball nut moves back and forth along the ball screw shaft, which causes the mobile frame 22 to move in the Y-axis direction.

The second drive mechanism 27 of the component-mounting device 2 is disposed on the mobile frame 22. The second drive mechanism 27 is a mechanism that moves the head unit 25 in the X-axis direction along the mobile frame 22. Similar to the first drive mechanism 26, the second drive mechanism 27 includes, for example, a drive motor, a ball screw shaft extending in the X-axis direction and connected to the drive motor, and a ball nut disposed on the head unit 25 and screwed on the ball screw shaft. According to the second drive mechanism 27 configured in this manner, as a result of the rotation of the ball screw shaft caused by the drive motor, the ball nut moves back and forth along the ball screw shaft, which causes the head unit 25 to move in the X-axis direction.

<Configuration of First Tape Feeder>

Figure 3:
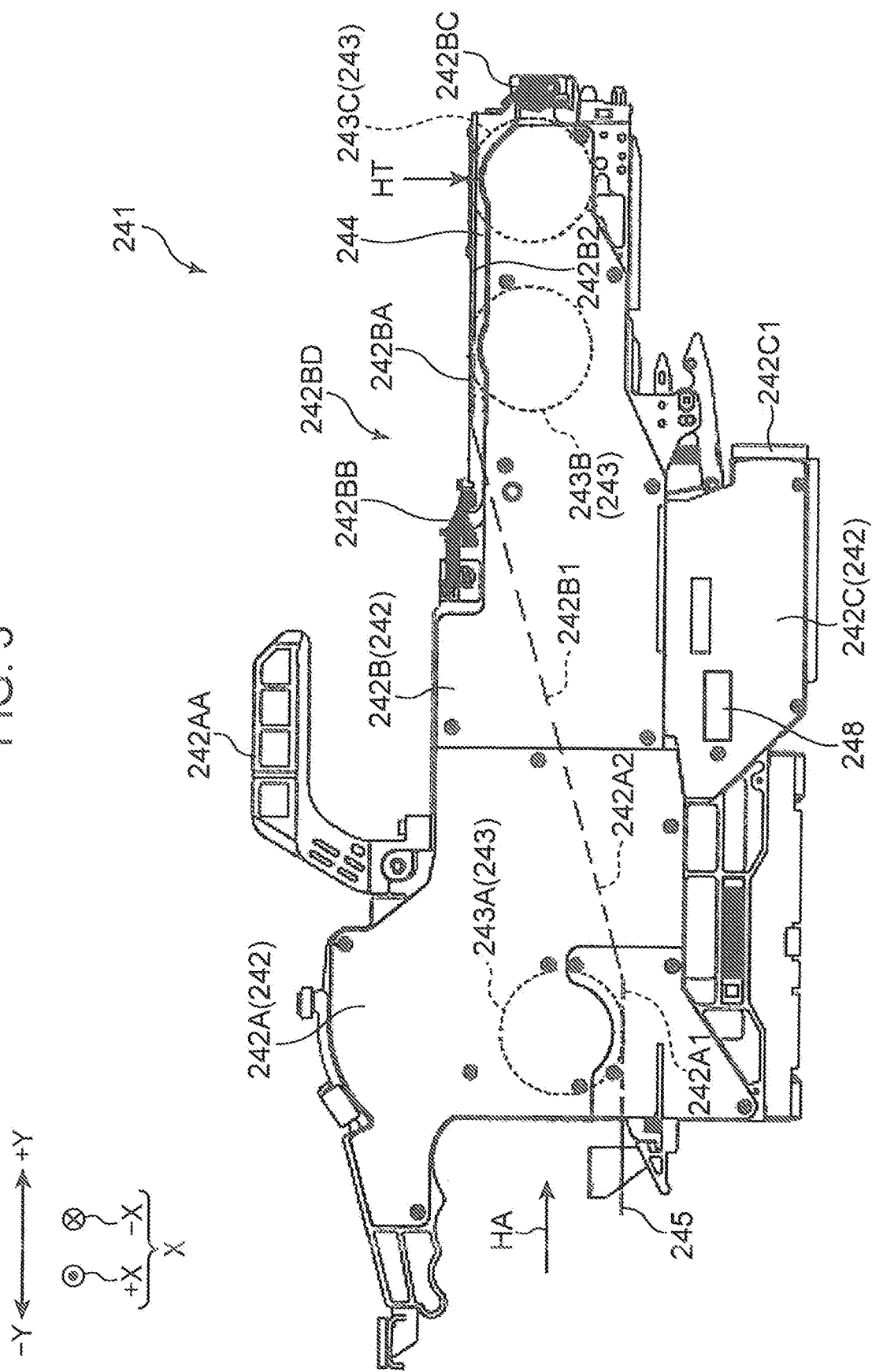
FIG. 3 depicts a configuration of a first tape feeder included in the component-mounting device.
Figure 4:
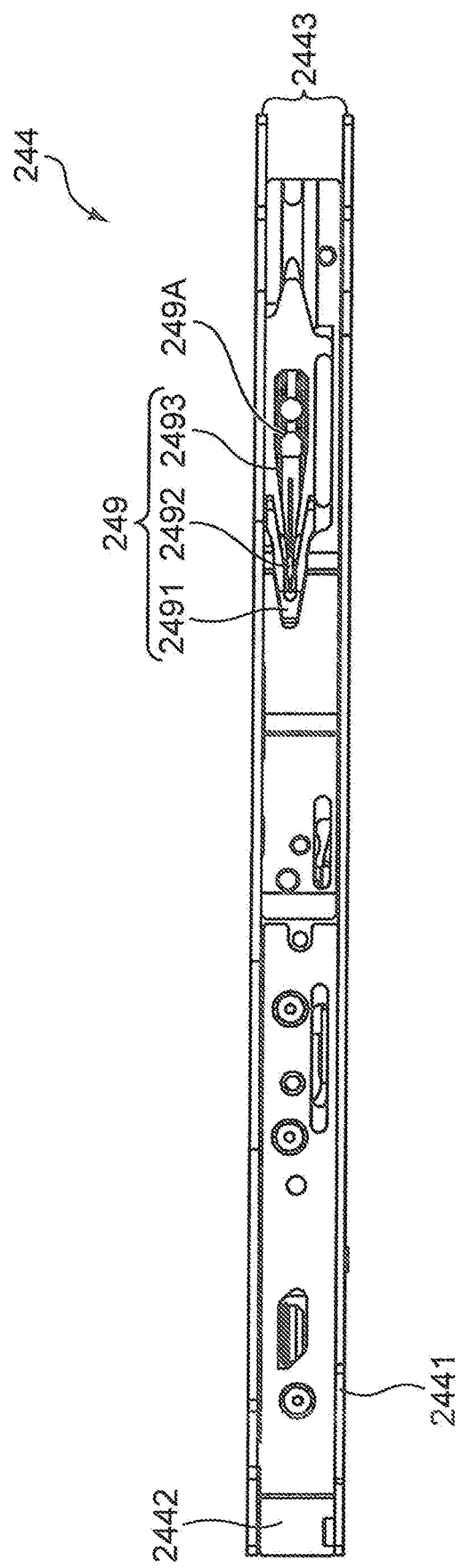
FIG. 4 depicts a configuration of a tape guide included in the first tape feeder.
Figure 5:
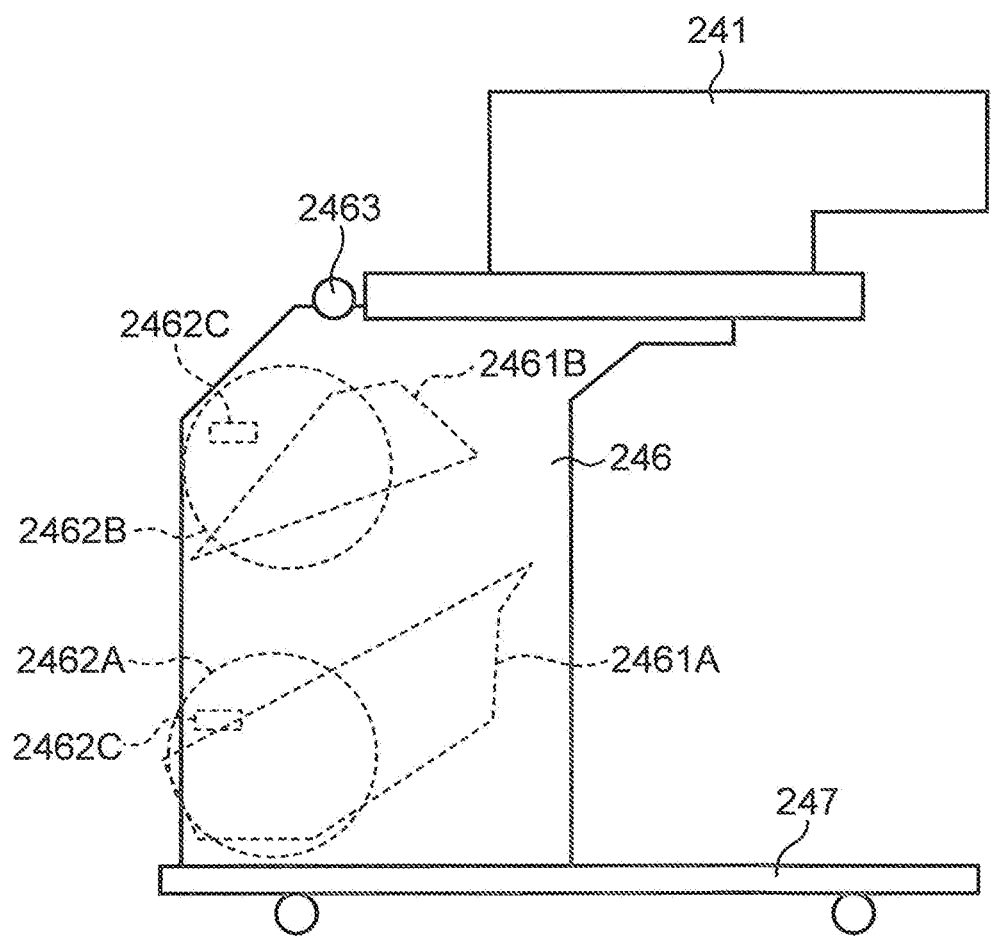
FIG. 5 depicts the first tape feeder in a state of being fitted with reels.
Figure 6:
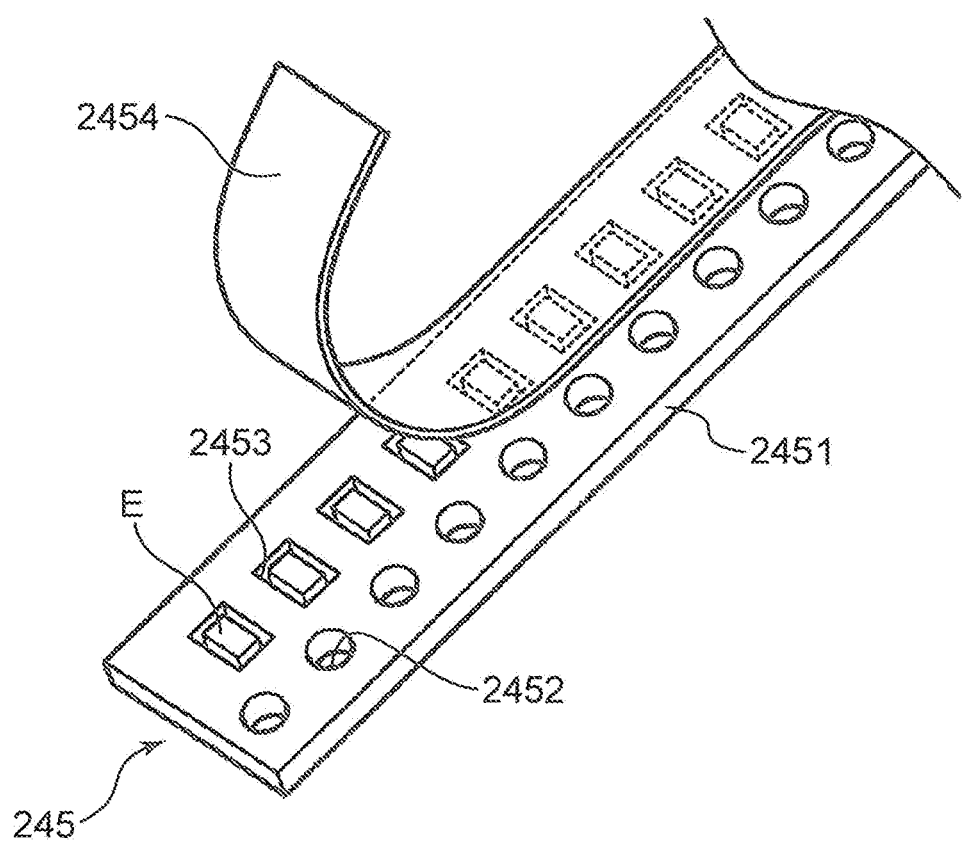
FIG. 6 is a perspective view of a component storage tape wound around a reel.

A configuration of the first tape feeder 241 operating according to the first supply method, the first tape feeder 241 being the tape feeder having the first longitudinal length, will then be described in detail with reference to FIGS. 3 to 6. FIG. 3 depicts the configuration of the first tape feeder 241. FIG. 4 depicts a configuration of the tape guide 244 included in the first tape feeder 241. FIG. 5 depicts the first tape feeder 241 in a state of being fitted with reels. FIG. 6 is a perspective view of a component storage tape 245 wound around a reel.

Before description of the configuration of the first tape feeder 241, the component storage tape 245 will be described first with reference to FIG. 6. The component storage tape 245 is made up of a carrier tape 2451 and a cover tape 2454. The carrier tape 2451 is a tape having a plurality of component storage portions 2453 storing components E therein, the component storage portions 2453 being arranged at given intervals. The carrier tape 2451 has transfer force transmission holes 2452 arranged at given intervals on one end in the width direction of the carrier tape 2451, the transfer force transmission holes 2452 engaging with teeth of a first sprocket 243A, a second sprocket 243B, and a third sprocket 243C of the first tape feeder 241, which first, second, and third sprockets 243A, 243B, and 243C will be described later, and receiving a transfer force for sending out the component storage tape 245, the transfer force being transmitted to the transfer force transmission holes 2452 by the first sprocket 243A, the second sprocket 243B, and the third sprocket 243C. The cover tape 2454 is a tape pasted on the carrier tape 2451 in such a way as to cover the component storage portions 2453.

As shown in FIG. 3, the first tape feeder 241 includes a feeder body 242, a tape send-off unit 243, and a tape guide 244. The feeder body 242 makes up an outer shell of the first tape feeder 241, and includes a first housing portion 242A, a second housing portion 242B, and a third housing portion 242C. The first housing portion 242A is disposed on the −Y-side in the Y-axis direction of the feeder body 242, and is formed as a box with a small width. Inside the first housing portion 242A, a first tape traveling path 242A1 extending horizontally in the Y-axis direction and a second tape traveling path 242A2 extending upward slantly from a +Y-side end of the first tape traveling path 242A1 are formed. The component storage tape 245 is taken into the first tape feeder 241 along the first tape traveling path 242A1 of the first housing portion 242A, travels through the first tape traveling path 242A1, and then travels on the second tape traveling path 242A2. On an upper surface of the first housing portion 242A, a handle 242AA that is used to carry the first tape feeder 241 is disposed.

The second housing portion 242B is coupled to a +Y-side end of the first housing portion 242A, and is formed as a box with the same width as that of the first housing portion 242A. Inside the second housing portion 242B, a third tape traveling path 242B1 is formed, the third tape traveling path 242B1 extending upward slantly in the same manner as the second tape traveling path 242A2, from a +Y-side end of the second tape traveling path 242A2 to reach an upper surface 242BA of the second housing portion 242B. From a +Y-side end of the third tape traveling path 242B1, the upper surface 242BA of the second housing portion 242B extends horizontally toward the +Y-side along the Y-axis direction to define a fourth tape traveling path 242B2. A component feeding position HT is set on a +Y-side end of the fourth tape traveling path 242B2. The component storage tape 245 travels through the first tape traveling path 242A1 and the second tape traveling path 242A2, and then travels through the third tape traveling path 242B1 and the fourth tape traveling path 242B2 in order to finally reach the component feeding position HT. Respective widths of the first tape traveling path 242A1, the second tape traveling path 242A2, the third tape traveling path 242B1, and the fourth tape traveling path 242B2 are determined to be the same.

On the second housing portion 242B, an area where the upper surface 242BA defining the fourth tape traveling path 242B2 is located serves as a tape guide fitting area 242BD to which the tape guide 244, which will be described later, is fitted. In other words, the tape guide fitting area 242BD has the upper surface 242BA defining the fourth tape traveling path 242B2. On the second housing portion 242B, a first holding portion 242BB and a second holding portion 242BC are disposed in the tape guide fitting area 242BD, the first holding portion 242BB and the second holding portion 242BC holding the tape guide 244 fitted to the tape guide fitting area 242BD. The first holding portion 242BB holds a −Y-side of the tape guide 244 while the second holding portion 242BC holds a +Y-side of the tape guide 244.

The third housing portion 242C is coupled to a lower end of the second housing portion 242B, and is formed as a box with the same width as that of the second housing portion 242B. The third housing portion 242C houses a control board for controlling an operation of the first tape feeder 241. To a +Y-side end of the third housing portion 242C, a connector 242C1 is attached. The connector 242C1 is supplied with power and various control signals from the component-mounting device 2.

The tape send-off unit 243 is disposed in the feeder body 242, and sends off the component storage tape 245 in a tape send-off direction HA along the direction of arrangement of the component storage portions 2453, toward the component feeding position HT. The tape send-off direction HA is a direction of heading from the −Y-side toward the +Y-side in the Y-axis direction. As shown in FIG. 3, the tape send-off unit 243 includes the first sprocket 243A, the second sprocket 243B, and the third sprocket 243C.

The first sprocket 243A is a disc-shaped sprocket that is supported in the first housing portion 242A in such a way as to be capable of rotating around an axis extending in the X-axis direction. The first sprocket 243A has a plurality of teeth arranged circumferentially at given intervals. The teeth of the first sprocket 243A can be fitted respectively in the transfer force transmission holes 2452 formed on the carrier tape 2451 of the component storage tape 245. Rotation of the first sprocket 243A sends off the component storage tape 245 including the carrier tape 2451 having the transfer force transmission holes 2452 engaged with the teeth of the first sprocket 243A.

The second sprocket 243B is a disc-shaped sprocket that is supported in the second housing portion 242B in such a way as to be capable of rotating around an axis extending in the X-axis direction. The second sprocket 243B has a plurality of teeth arranged circumferentially at given intervals. The teeth of the second sprocket 243B can be fitted respectively in the transfer force transmission holes 2452 formed on the carrier tape 2451 of the component storage tape 245. In the second housing portion 242B, the second sprocket 243B is located on an upstream side in the tape send-off direction HA of the tape guide fitting area 242BD. The second sprocket 243B receives the component storage tape 245 having been sent off from the first sprocket 243A and traveled through the first tape traveling path 242A1 and the second tape traveling path 242A2 to travel on the third tape traveling path 242B1 and sends off the component storage tape 245 toward the component feeding position HT. The second sprocket 243B thus causes the component storage tape 245 to travel on the fourth tape traveling path 242B2.

The third sprocket 243C is a disc-shaped sprocket that is supported in the second housing portion 242B in such a way as to be capable of rotating around an axis extending in the X-axis direction. The third sprocket 243C has a plurality of teeth arranged circumferentially at given intervals. The teeth of the third sprocket 243C can be fitted respectively in the transfer force transmission holes 2452 formed on the carrier tape 2451 of the component storage tape 245. In the second housing portion 242B, the third sprocket 243C is located on a downstream side in the tape send-off direction HA of the tape guide fitting area 242BD. This means that the third sprocket 243C is located at a position that matches the component feeding position HT in the tape send-off direction HA. The third sprocket 243C receives the component storage tape 245 having been sent off from the second sprocket 243B to travel on the fourth tape traveling path 242B2 and sends off the component storage tape 245 in such a way as to cause it to pass through the component feeding position HT. Thus, in a configuration in which the third sprocket 243C is located at the position that matches the component feeding position HT in the tape send-off direction HA and receives the component storage tape 245 at that position, the component storage tape 245 can be sent off in a state in which the component storage tape 245 is positioned highly precisely relative to the component feeding position HT.

The tape guide 244 included in the first tape feeder 241 will then be described with reference to FIGS. 3 and 4. The tape guide 244, which is a long and narrow member extending in the Y-axis direction, is fitted to the tape guide fitting area 242BD of the second housing portion 242B of the feeder body 242. The width of the tape guide 244 is determined to be the same as that of the second housing portion 242B. The tape guide 244 guides the component storage tape 245, which is sent off by the second sprocket 243B and the third sprocket 243C, when the component storage tape 245 travels on the fourth tape traveling path 242B2. According to this embodiment, the tape guide 244 is fitted to the tape guide fitting area 242BD in such a way as to cover the upper surface 242BA of the tape guide fitting area 242BD of the second housing portion 242B from above the upper surface 242BA.

The tape guide 244 includes a guide body 2441, a first locking portion 2442, and a second locking portion 2443. The guide body 2441 makes up an outer shell of the tape guide 244. In a state in which the tape guide 244 is fitted to the tape guide fitting area 242BD of the second housing portion 242B, the guide body 2441 covers the upper surface 242BA of the tape guide fitting area 242BD from above. The guide body 2441 and the upper surface 242BA of the tape guide fitting area 242BD of the second housing portion 242B jointly define the fourth tape traveling path 242B2.

As shown in FIG. 4, the guide body 2441 has a component feeding opening 249A that, on the first tape feeder 241, defines the component feeding position HT of the component E relative to the suction nozzle 251. To put it another way, the first tape feeder 241 has the component supply opening 249A formed on the guide body 2441 of the tape guide 244.

As shown in FIG. 4, the guide body 2441 is fitted with a component exposing portion 249. The component exposing portion 249 exposes the component E in the component storage portion 2453 of the component storage tape 245, which is guided by the tape guide 244 and travels on the fourth tape traveling path 242B2. The component exposing portion 249 includes an insertion portion 2491, a blade 2492, and a cover tape post-processing portion 2493.

On the component exposing portion 249, the insertion portion 2491 is a thin plate-like portion of a tapered shape. The insertion portion 2491 is inserted between the carrier tape 2451 and the cover tape 2454 of the component storage tape 245, which is sent off by the second sprocket 243B and travels on the fourth tape traveling path 242B2 as a front end of the component storage tape 245 is kept free. On the component exposing portion 249, the blade 2492 is located on the downstream side in the tape send-off direction HA relative to the insertion portion 2491, and cuts the cover tape 2454 along a straight line in the tape send-off direction HA as the component storage tape 245 travels. On the component exposing portion 249, the cover tape post-processing portion 2493 is located on the downstream side in the tape send-off direction HA relative to the blade 2492, and carries out a process of pushing and spreading out the cover tape 2454 cut by the blade 2492. This exposes the component E in the component storage portion 2453 of the component storage tape 245. Thus, the component E, which is exposed in the component storage portion 2453 at the component feeding position HT, is sucked and taken out by the suction nozzle 251 of the head unit 25 of the component-mounting device 2 through the component supply opening 249A.

On the tape guide 244, the first locking portion 2442 is located on a −Y-side end of the guide body 2441. The first locking portion 2442 is locked onto the first holding portion 242BB in the tape guide fitting area 242BD of the second housing portion 242B. As a result, a −Y-side end of the tape guide 244 is held by a −Y-side end of the tape guide fitting area 242BD. On the tape guide 244, the second locking portion 2443 is located on a +Y-side end of the guide body 2441. The second locking portion 2443 is locked onto the second holding portion 242BC in the tape guide fitting area 242BD of the second housing portion 242B. As a result, a +Y-side end of the tape guide 244 is held by a +Y-side end of the tape guide fitting area 242BD.

To a side surface of the first tape feeder 241, a first recording portion 248 (see FIG. 3) is attached. The first recording portion 248 records feeder information for identifying the first tape feeder 241 that is fitted in the component feeding units 24A, 24B, 24C, and 24D. The feeder information recorded on the first recording portion 248 is information that associates feeder identifying information for identifying the first tape feeder 241 with tape guide size information on the size of the tape guide 244. The size of the tape guide 244 is determined to be a proper size by taking account of the size of the component, the width of the component storage tape 245, an extent of spreading of the cut cover tape 2454 by the cover tape post-processing portion 2493, and the like. These pieces of information on the size of the tape guide 244 make up the tape guide size information. The first recording portion 248 is provided as, for example, a bar code carrying encoded feeder information. When setting the first tape feeder 241 at each set position defined for each component in the component feeding units 24A, 24B, 24C, and 24D, the operator reads the first recording portion 248 attached to the first tape feeder 241, using a reading device, such as a bar code reader. Similarly, to a side surface of the second tape feeder 241A, which is different from the first tape feeder 241, a recording portion carrying feeder information for identifying the second tape feeder 241A is attached. It should be noted, however, that because the second tape feeder 241A has no tape guide 244, the feeder information recorded on the recording portion attached to the second tape feeder 241A does not include the tape guide size information on the size of the tape guide 244.

A shown in FIG. 5, under each of a plurality of tape feeders including the first tape feeders 241, a reel support 246 supported by a truck 247 is disposed. The reel support 246 supports a first reel holder 2461A and a second reel holder 2461B in such a way as to keep them separated from each other in the vertical direction. The first reel holder 2461A and the second reel holder 2461B hold a first reel 2462A and a second reel 2462B, respectively, in such a way as to allow them to rotate, the first reel 2462A and the second reel 2462B being wound with component storage tapes 245, respectively.

The component storage tape 245 wound around the first reel 2462A or the second reel 2462B is guided by a guide roller 2463 disposed on an upper end of the reel support 246 and therefore proceeds to the first sprocket 243A, the second sprocket 243B, and the third sprocket 243C. The component storage tape 245 having its transfer force transmission holes 2452 engaged with the teeth of the first sprocket 243A, the second sprocket 243B, and the third sprocket 243C is sent off as a result of rotation of the first sprocket 243A, the second sprocket 243B, and the third sprocket 243C.

On respective side surfaces of the first reel 2462A and the second reel 2462B, a second recording portion 2462C (see FIG. 5) is attached. The second recording portion 2462C carries readable component information including component identifying information for identifying components E stored in the component storage tapes 245 wound respectively around the first reel 2462A and the second reel 2462B, component name information on component names, reel identifying information, and lot identifying information for identifying a reel lot. The second recording portion 2462C is provided as, for example, a bar code carrying encoded readable component information. When setting the component storage tape 245 on the first tape feeder 241, the operator reads the second recording portion 2462C attached to the first reel 2462A and the second reel 2462B, using a reading device, such as a bar code reader. Similarly, to a side surface of a reel fitted to the second tape feeder 241A, which is different from the first tape feeder 241, a recording portion carrying readable component information is attached.

<Component Feeding Operation of Tape Feeder>

[Component Feeding Operation of First Tape Feeder]

The first tape feeder 241 operating according to the first supply method, i.e., autoloading tape supply method carries out a component feeding operation in the following manner. As preparation work, the operator first attaches the first reel 2462A to the first reel holder 2461A held at a lower stage of the reel support 246, and fits a front end of the component storage tape 245 wound around the first reel 2462A to the first sprocket 243A. The operator then enters an instruction to rotate the first sprocket 243A, thereby causing the first sprocket 243A to send off the component storage tape 245, and then fits the front end of the component storage tape 245 to the second sprocket 243B.

At a point at which the above preparation work is over, the first tape feeder 241 starts its component feeding operation. In the first tape feeder 241, the second sprocket 243B rotates, thus feeding the component storage tape 245. At this time, the first sprocket 243A is left idling. The component storage tape 245 is therefore sent off by the rotating second sprocket 243B only.

Subsequently, as the first reel 2462A is sending out the component storage tape 245, the operator carries out work of disengaging the component storage tape 245 from the first sprocket 243A. At this point of time, the component storage tape 245 is already fitted to the second sprocket 243B. When disengaged from the first sprocket 243A, therefore, the component storage tape 245 is kept sent off by the rotating second sprocket 243B.

Subsequently, as the first reel 2462A is sending out the component storage tape 245, the operator removes the first reel 2462A from the first reel holder 2461A at the lower stage to attach the first reel 2462A to the second reel holder 2461B at an upper stage. Subsequently, as the first reel 2462A, which is held by the second reel holder 2461B at the upper stage, is sending out the component storage tape 245, the operator attaches the second reel 2462B wound with another component storage tape 245 to the first reel holder 2461A at the lower stage, and fits a front end of the component storage tape 245 wound around the second reel 2462B to the first sprocket 243A. In this manner, before the component storage tape 245 wound around the first reel 2462A runs out, the second reel 2462B can be attached to the first reel holder 2461A.

Subsequently, at a point of time at which the first reel 2462A, which is held by the second reel holder 2461B at the upper stage, has sent out the component storage tape 245 completely, the second reel 2462B, which is held by the first reel holder 2461A at the lower stage, automatically starts feeding the component storage tape 245. In this manner, transition from the preceding component storage tape 245 to the following component storage tape 245 is performed automatically.

[Component Feeding Operation of Second Tape Feeder 241A]

The second tape feeder 241A operating according to the second supply method, i.e., splicing tape supply method carries out a component feeding operation in the following manner. The operator first fits one reel to the second tape feeder 241A. The component storage tape 245 wound around the reel fitted to the second tape feeder 241A is sent off by a tape send-off mechanism. As a result, the components E stored in the component storage tape 245 are fed. At a point of time at which the component storage tape 245 is sent off completely from the one reel fitted to the tape feeder 214A, to perform transition from the component storage tape 245, i.e., a preceding component storage tape 245, to a component storage tape 245 for replenishment, the operator carries out splicing work of splicing a rear end of the preceding component storage tape 245 to a front end of the component storage tape 245 for replenishment by pasting a splicing tape or the like on a part where both ends join. At the second tape feeder 241A, transition from the preceding component storage tape 245 to the following component storage tape 245 for replenishment is performed by the operator, as the above splicing work.

<Component Supply Work Carried Out at Tape Feeder>

[Component Supply Work Carried Out at First Tape Feeder]

In the case of the first tape feeder 241, as described above, at a point of time at which the first reel 2462A, which is held by the second reel holder 2461B at the upper stage, has sent out the component storage tape 245 completely, the second reel 2462B, which is held by the first reel holder 2461A at the lower stage, automatically starts feeding the component storage tape 245. In this state, the operator removes the first reel 2462A, which runs out of a tape to send off, from the second reel holder 2461B at the upper stage, and then moves the second reel 2462B from the first reel holder 2461A at the lower stage to attach the second reel 2462B to the second reel holder 2461B at the upper stage. Hence, a new reel wound with a component storage tape 245 can be supplied to the first reel holder 2461A at the lower stage.

At this time, the operator carries out reading work of reading the second recording portion 2462C attached to the new reel for replenishment, using the reading device. The operator carries out also reading work of reading the first recording portion 248 attached to the first tape feeder 241 supplied with the new reel, using the reading device. Information read by the reading device, i.e., feeder information recorded on the first recording portion 248 and readable component information recorded on the second recording portion 2462C are input to the feeder management device 3 via a data communication unit 31, which will be described later. Upon receiving the feeder information and readable component information, the feeder management device 3 checks these pieces of information and judges whether the operator is properly fitting the new reel for replenishment to the first tape feeder 241.

At the first tape feeder 241, a period between a point of time at which the first reel 2462A runs out of the component storage tape to send off and a point of time at which the second reel 2462B runs out of the component storage tape to send off is a supply time zone in which a new reel can be supplied. This means that the first tape feeder 241 allows choosing a proper point of time to supply a new reel within the supply time zone, thus giving a high degree of freedom in supplying a new reel. If respective supply time zones of a plurality of first tape feeders 241 overlap to create an overlapping supply time zone, new reels can be supplied to the first tape feeders 241, respectively, at the same point of time within the overlapping supply time zone. Specifically, "collective supply", which allows the operator to carry out component supply work collectively, can be performed at the first tape feeders 241 that can be supplied with reels, respectively, at the same point of time. As described above, the first tape feeder 241 does not require component supply work of a special form, such as splicing work, and allows "collective supply". It can be said, therefore, that the first tape feeder 241 is a tape feeder that improves the efficiency of tape feeder pre-arrangement work and component supply work.

[Component Supply Work Carried Out at Second Tape Feeder]

According to the second tape feeder 241A, as described above, at the point of time at which the component storage tape 245 is sent off completely from the one reel fitted to the tape feeder 214A, the operator carries out splicing work of splicing the rear end of the preceding component storage tape 245 to the front end of the component storage tape 245 for replenishment, as component supply work. At this time, the operator carries out reading work of reading a recording portion attached to a reel wound with the component storage tape 245 for replenishment, using the reading device. The operator carries out also reading work of reading a recording portion attached to the second tape feeder 241A for which the splicing work is done, using the reading device. Information read by the reading device, i.e., feeder information recorded on the recording portion of the second tape feeder 241A and readable component information recorded on the recording portion of the reel are input to the feeder management device 3 via the data communication unit 31, which will be described later. Upon receiving the feeder information and readable component information, the feeder management device 3 checks these pieces of information and judges whether the operator is properly supplying the component storage tape 245 for replenishment to the second tape feeder 241A.

According to the second tape feeder 241A, the splicing work is carried out at the point of time at which the component storage tape 245 is sent off completely from the one reel. A point of time of supplying the reel wound with the component storage tape 245 for replenishment is, therefore, limited to the point of time at which the preceding component storage tape 245 is sent off completely.

<Configuration of Feeder Management Device>

Figure 7:
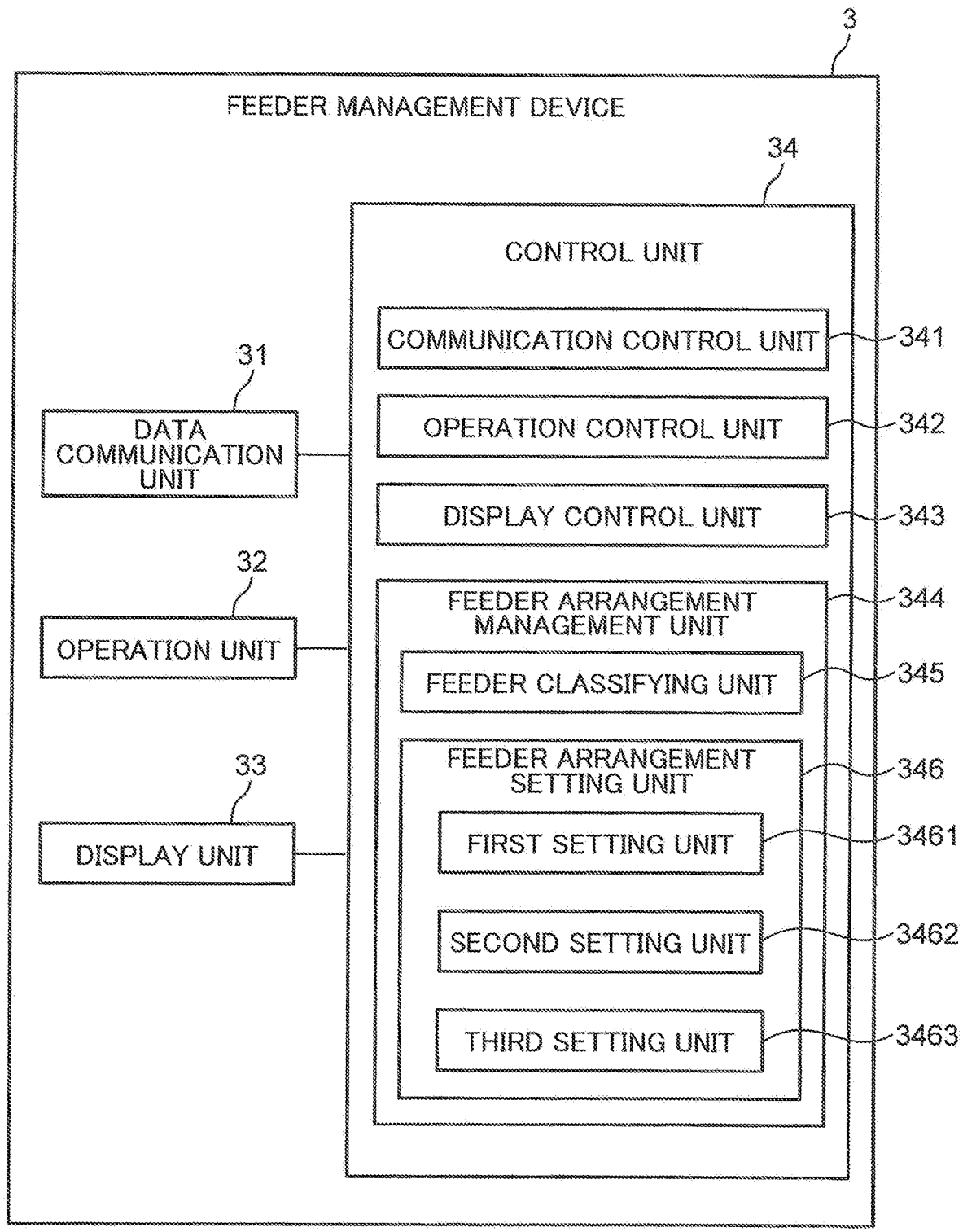
FIG. 7 is a block diagram of a configuration of the feeder management device.

The feeder management device 3 is a device that manages arrangement of a plurality of tape feeders (first tape feeders 241 and second tape feeders 241A) in the component feeding units 24A, 24B, 24C, and 24D of the component-mounting device 2. In a state in which various first tape feeders 241 and second tape feeders 241A different in shape and in method of supplying component storage tapes 245 are present together, the feeder management device 3 enables arrangement of the tape feeders that allows the operator to smoothly carry out pre-arrangement work and component supply work. In pre-arrangement work, the operator carries out reading work of reading the first recording portion 248 attached to the first tape feeder 241 and the recording portion attached to the second tape feeder 241A, using the reading device, and then sets the first tape feeder 241 and the second tape feeder 241A in their respective set positions defined for each component in the component feeding units 24A, 24B, 24C, and 24D. In this process, the operator sets the first tape feeder 241 and the second tape feeder 241A according to tape feeder arrangement set by a feeder arrangement setting unit 346 of the feeder management device 3, which feeder arrangement setting unit 346 will be described later. A configuration of the feeder management device 3 will be described with reference to FIGS. 1 and 7. FIG. 7 is a block diagram of the configuration of the feeder management device 3.

As described above, the feeder management device 3 is connected to the mounting operation management device 4 and the production plan management device 5 in such a way as to be capable of data communication with the mounting operation management device 4 and the production plan management device 5, as shown in FIG. 1. The feeder management device 3 includes, for example, a microcomputer, and has a data communication unit 31, an operation unit 32, a display unit 33, and a control unit 34, as shown in FIG. 7.

In the feeder management device 3, the operation unit 32 has a touch panel, numerical keys, a start key, a setting key, and the like, and functions as an input unit to which an instruction on setting arrangement of a plurality of tape feeders is input. The operator executes an operation of inputting an instruction to the operation unit 32.

The data communication unit 31 is an interface circuit through which data communication with the mounting operation management device 4 and the production plan management device 5 is carried out. The data communication unit 31 acquires incoming information from the operation management device 4 and the production plan management device 5 and gives the acquired information to the control unit 34. In addition, the data communication unit 31 transmits (outputs) information given by the control unit 34, to the operation management device 4 and to the production plan management device 5.

Further, the data communication unit 31 acquires readable component information, which is read by the reading device from the recording portion attached to the reel wound with the component storage tape 245, and feeder information, which is read by the reading device from the recording portions attached respectively to the first tape feeder 241 and the second tape feeder 241A, and gives the acquired readable component information and feeder information to the control unit 34.

The mounting operation management device 4 and the production plan management device 5, which are connected to the feeder management device 3 in such a way as to be capable of data communication therewith, will be described.

The mounting operation management device 4 is a device that is disposed close to the production lines 20A and 20B in each of which a plurality of component-mounting devices 2 are arranged in a row and that manages component mounting operations (component packaging operations) carried out by the component-mounting devices 2. The mounting operation management device 4 is provided as, for example, a microcomputer. The operator in charge of each of the production lines 20A and 20B operates the mounting operation management device 4 to cause it to control the component mounting operations of the component-mounting devices 2. The mounting operation management device 4 receives input of arrangement setting information created by the feeder arrangement setting unit 346 that will be described later, the arrangement setting information being transmitted from the feeder management device 3 to the mounting operation management device 4 via the data communication unit 31. The arrangement setting information is information indicating a result of setting of tape feeder arrangement in the component feeding units 24A, 24B, 24C, and 24D of the component-mounting device 2, the setting of tape feeder arrangement being made by the feeder arrangement setting unit 346. In carrying out tape feeder pre-arrangement work, the operator in charge of each of the production lines 20A and 20B arranges tape feeders in the component feeding units 24A, 24B, 24C, and 24D of the component-mounting device 2 such that the tape feeders are put in the tape feeder arrangement indicated by the arrangement setting information.

The production plan management device 5 is a device that manages a production plan for producing component-mounting boards by the component-mounting devices 2. The production plan management device 5 is provided as, for example, a microcomputer. Being operated by an operator who sets up a production plan, the production plan management device 5 transmits production plan information on the production plan for producing the component-mounting boards, to the feeder management device 3. The production plan information includes mounted component information such as identification information for identifying components used for production of the component-mounting boards, and component name information on component names; number-of-components information on the number of components to be mounted on one component-mounting board; production order information on the order of production of the component-mounting boards; and production volume information on the volume of component-mounting boards produced per unit period (e.g., one day). The production plan information transmitted by the production plan management device 5 is input to the feeder management device 3 via the data communication unit 31. The feeder management device 3 refers to the production plan information, which is input to the feeder management device 3 via the data communication unit 31, and manages arrangement of tape feeders to set each tape feeder at each set position defined for each component in the component feeding units 24A, 24B, 24C, and 24D.

In the feeder management device 3, the control unit 34 is composed of a central processing unit (CPU), a read-only memory (ROM) that stores a control program, a random access memory (RAM) used as a work area for the CPU, and the like. In the control unit 34, the CPU executes a control program stored in the ROM. The control unit 34 thus controls the data communication unit 31, the operation unit 32, and the display unit 33 and creates and outputs various pieces of information on arrangement of tape feeders in the component feeding units 24A, 24B, 24C, and 24D. As shown in FIG. 7, the control unit 34 includes a communication control unit 341, an operation control unit 342, a display control unit 343, and a feeder arrangement management unit 344.

The communication control unit 341 controls data communication with the mounting operation management device 4 and the production plan management device 5, the data communication being carried out through the data communication unit 31. The operation control unit 342 controls the operation unit 32. The display control unit 343 controls information display performed by the display unit 33.

The feeder arrangement management unit 344 manages arrangement of tape feeders in the component feeding units 24A, 24B, 24C, and 24D of the component-mounting device 2. The feeder arrangement management unit 344 includes a feeder classifying unit 345 and the feeder arrangement setting unit 346.

In a state in which various tape feeders (first tape feeders 241 and second tape feeders 241A) that differ in shape, and in a method of supplying the component storage tape 245, are present together, the feeder classifying unit 345 classifies the tape feeders into a plurality of types of tape feeders, based on a given classification index. The classification index is an index for classifying tape feeders according to shape or method of supplying the component storage tape 245. According to this embodiment, the feeder classifying unit 345 uses the longitudinal length of the tape feeder as the above classification index on the shape of the tape feeder. The feeder classifying unit 345 uses the longitudinal length of the tape feeder as the classification index, thus classifying a plurality of tape feeders into tape feeders having the first longitudinal length and tape feeders having the second longitudinal length shorter than the first longitudinal length.

As described above, when component storage tapes having the same width are used respectively by the first tape feeder 241 operating according to the first supply method and the second tape feeder 241A operating according to the second supply method, the longitudinal length of the second tape feeder 241A is determined to be shorter than that of the first tape feeder 241. In other words, when the method of supplying the component storage tape 245 is used as the classification index, the feeder classifying unit 345 classifies the first tape feeder 241 operating according to the first supply method, as "tape feeder having the first longitudinal length" and classifies the second tape feeder 241A operating according to the second supply method, as "tape feeder having the second longitudinal length".

The feeder arrangement setting unit 346 refers to an instruction on setting of arrangement of a plurality of tape feeders 241 and 241A, the instruction being input to the operation unit 32, and sets arrangement of the plurality of tape feeders 241 and 241A in the component feeding units 24A, 24B, 24C, and 24D, according to classification made by the feeder classifying unit 345. The feeder arrangement setting unit 346 includes a first setting unit 3461, a second setting unit 3462, and a third setting unit 3463.

Figure 8:
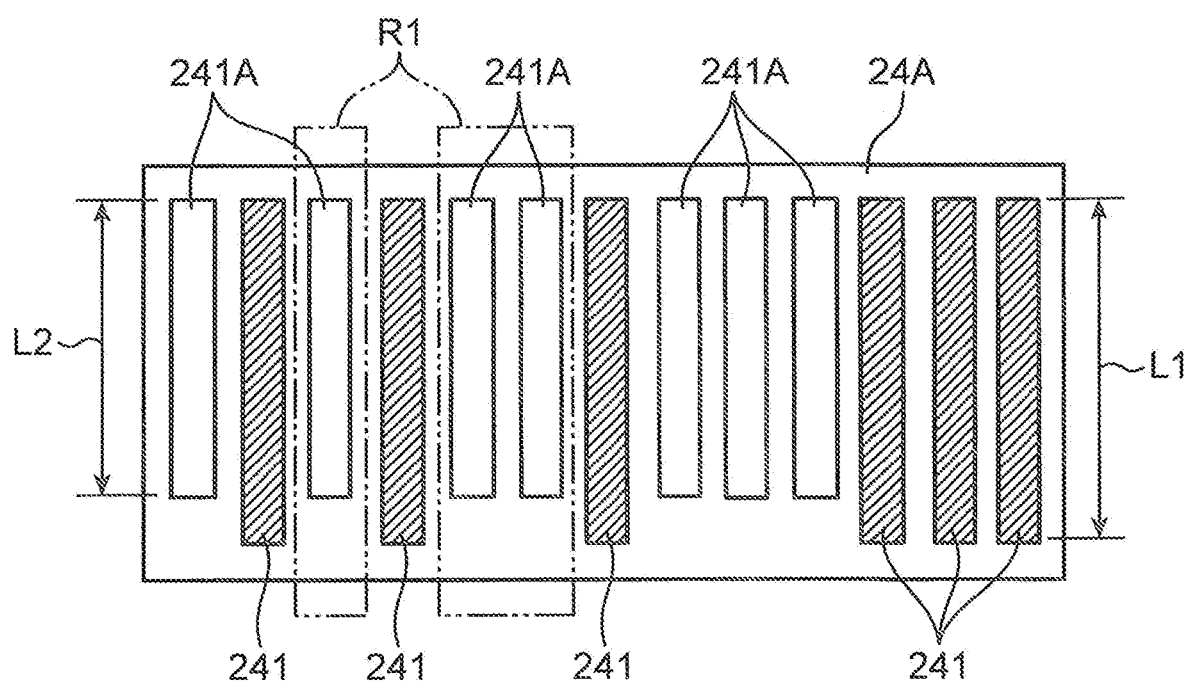
FIG. 8 is a diagram for describing a tape feeder arrangement state set by a third setting unit of a feeder arrangement setting unit in the feeder management device.

The third setting unit 3463 of the feeder arrangement setting unit 346 will first be described with reference to FIG. 8. FIG. 8 is a diagram for describing a tape feeder arrangement state set by the third setting unit 3463. FIG. 8 depicts a tape feeder arrangement state in the component feeding unit 24A among four component feeding units, i.e., component feeding units 24A, 24B, 24C, and 24D included in the component-mounting device 2.

When a third arrangement specifying instruction is input to the operation unit 32, the third arrangement specifying instruction specifying tape feeder arrangement that takes account of the efficiency of production of the component-mounting board by the component-mounting device 2, the third setting unit 3463 sets arrangement of a plurality of tape feeders 241 and 241A, based on the third arrangement specifying instruction. The arrangement of the tape feeders 241 and 241A that is set by the third setting unit 3463, based on the third arrangement specifying instruction, is the arrangement that attaches great importance to the efficiency of production of the component-mounting board. FIG. 8 demonstrates that in the component feeding unit 24A, between first tape feeders 241 each having a first longitudinal length L1, second tape feeders 241A each having a second longitudinal length L2 shorter than the first longitudinal length L1 are located in areas R1 encircled respectively with two-dot chain lines. Such arrangement of tape feeders 241 and 241A is arrangement that leads to the high efficiency of production of the component-mounting board.

In this arrangement, however, pre-arrangement work and component supply work on the second tape feeders 241A located in the areas R1 encircled with the two-dot chain lines are difficult. Pre-arrangement work on the second tape feeders 241A includes inserting and pulling the second tape feeders 241A in and out of the component feeding unit 24A. Component supply work on the second tape feeders 241A includes reading work, by which recording portions attached to the second tape feeders 241A are read using the reading device, and splicing work.

Figure 9:
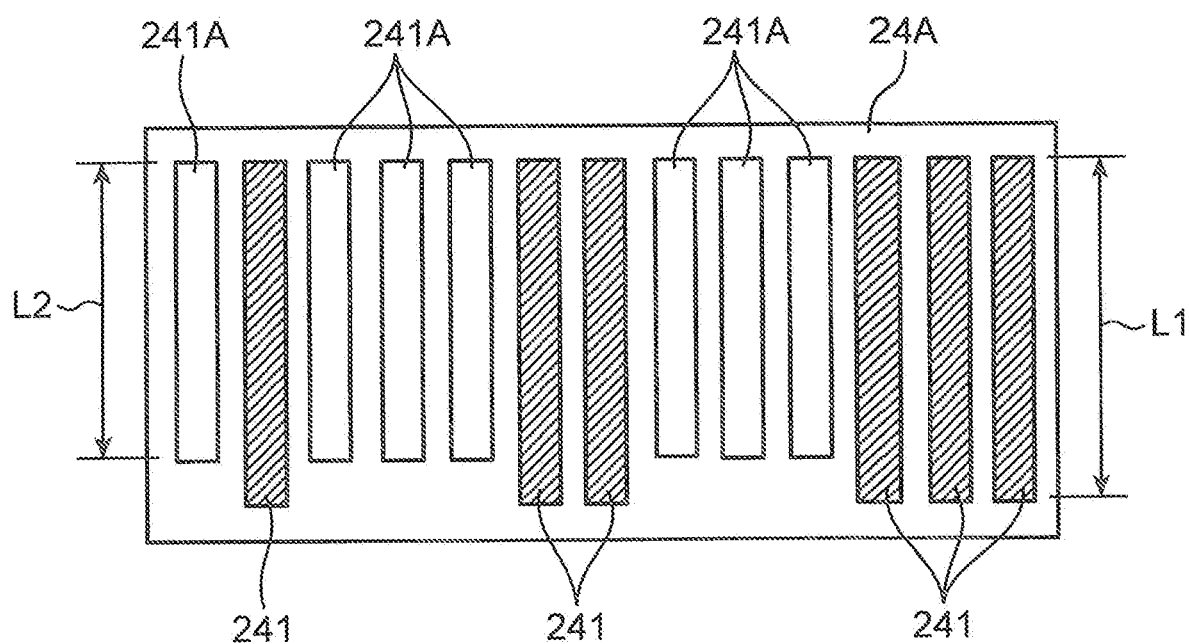
FIG. 9 is a diagram for describing a tape feeder arrangement state set by a first setting unit of the feeder arrangement setting unit.

The first setting unit 3461 of the feeder arrangement setting unit 346 will then be described with reference to FIG. 9. FIG. 9 is a diagram for describing a tape feeder arrangement state set by the first setting unit 3461. FIG. 9 depicts a tape feeder arrangement state in the component feeding unit 24A among four component feeding units, i.e., component feeding units 24A, 24B, 24C, and 24D included in the component-mounting device 2.

The first setting unit 3461 extracts a special type feeder (second tape feeder 241A) that is classified as a tape feeder of a special type by the feeder classifying unit 345. The first setting unit 3461 sets arrangement of a plurality of tape feeders 241 and 241A such that in an area of the component feeding unit 24A, the area being defined by excluding at least both ends of the component feeding unit 24A in the direction of arrangement in a row (X-axis direction), a given reference number or more of special type feeders (second tape feeder 241A) are arranged consecutively in a row. This provides a tape feeder arrangement that allows various tape feeders 241 and 214A, which differ in shape and in a method of supplying the component storage tape 245, to be present together, thereby allowing the operator to smoothly carry out the pre-arrangement and component supply work. As a result, stops during component feeding from the tape feeder due to delays in the pre-arrangement and component supply work can be prevented. The reduction of efficiency of the production of the component-mounting board can be prevented as much as possible.

The reference number representing the number of special type feeders (second tape feeders 241A) arranged consecutively in a row in the component feeding unit 24A is a fixed number set in advance. The reference number may be specified by the operator such that the operator enters the reference number on the operation unit 32. Hence, arrangement of a plurality of tape feeders 241 and 241A in the component feeding unit 24A can be set such that the reference number or more of special type feeders (second tape feeders 241A), the reference number being specified by the operator, are arranged consecutively in a row. In the example shown in FIG. 9, the reference number is specified as "3". At both ends of the component feeding unit 24A in the direction of arrangement of tape feeders in a row (X-axis direction), exceptional arrangement is adopted, according to which not the reference number but, for example, (reference number-1) is applied.

According to this embodiment, the operation unit 32 is configured to receive input of a first arrangement specifying instruction to specify arrangement that takes account of the shape of the tape feeder. When the first arrangement specifying instruction is input to the operation unit 32, the first setting unit 3461 sets tape feeder arrangement that follows the first arrangement specifying instruction. More specifically, the first setting unit 3461 extracts second tape feeders 241A having the second longitudinal length L2, as special type feeders, and sets tape feeder arrangement in the component feeding unit 24A such that the reference number or more of second tape feeders 241A having the second longitudinal length L2 are arranged consecutively in a row. As a result, even when second tape feeders 241A having the second longitudinal length L2 are located between first tape feeders 241 having the first longitudinal length L1, a work space for carrying out pre-arrangement work and component supply work on the second tape feeder 241A having the second longitudinal length L2 can be secured. This provides tape feeder arrangement that in a state in which various first tape feeders 241 and second tape feeders 214A different in shape are present together, allows the operator to smoothly carry out pre-arrangement work and component supply work.

Figure 10:
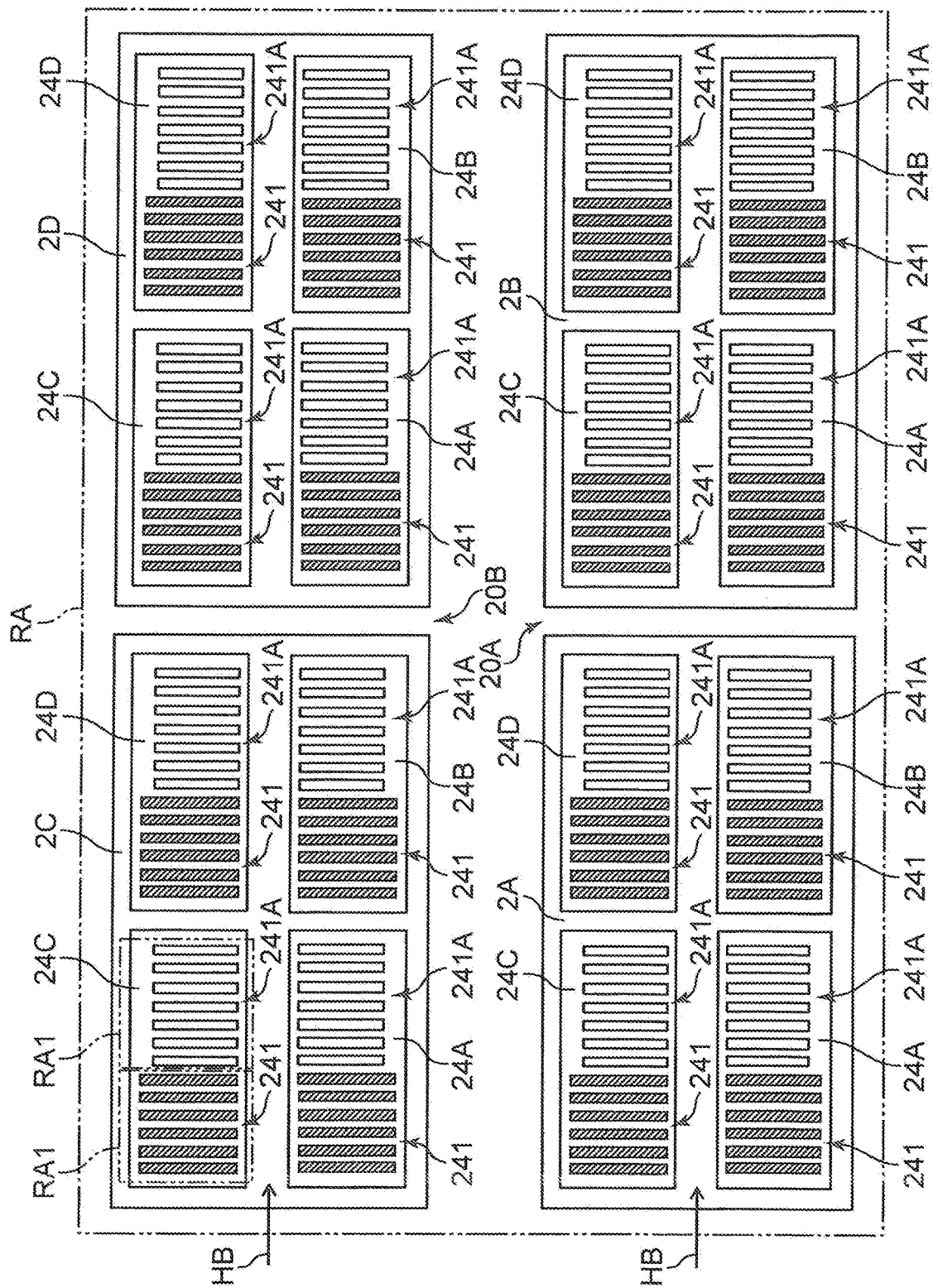
FIG. 10 is a diagram for describing a first example of a tape feeder arrangement state set by a second setting unit of the feeder arrangement setting unit.
Figure 11:
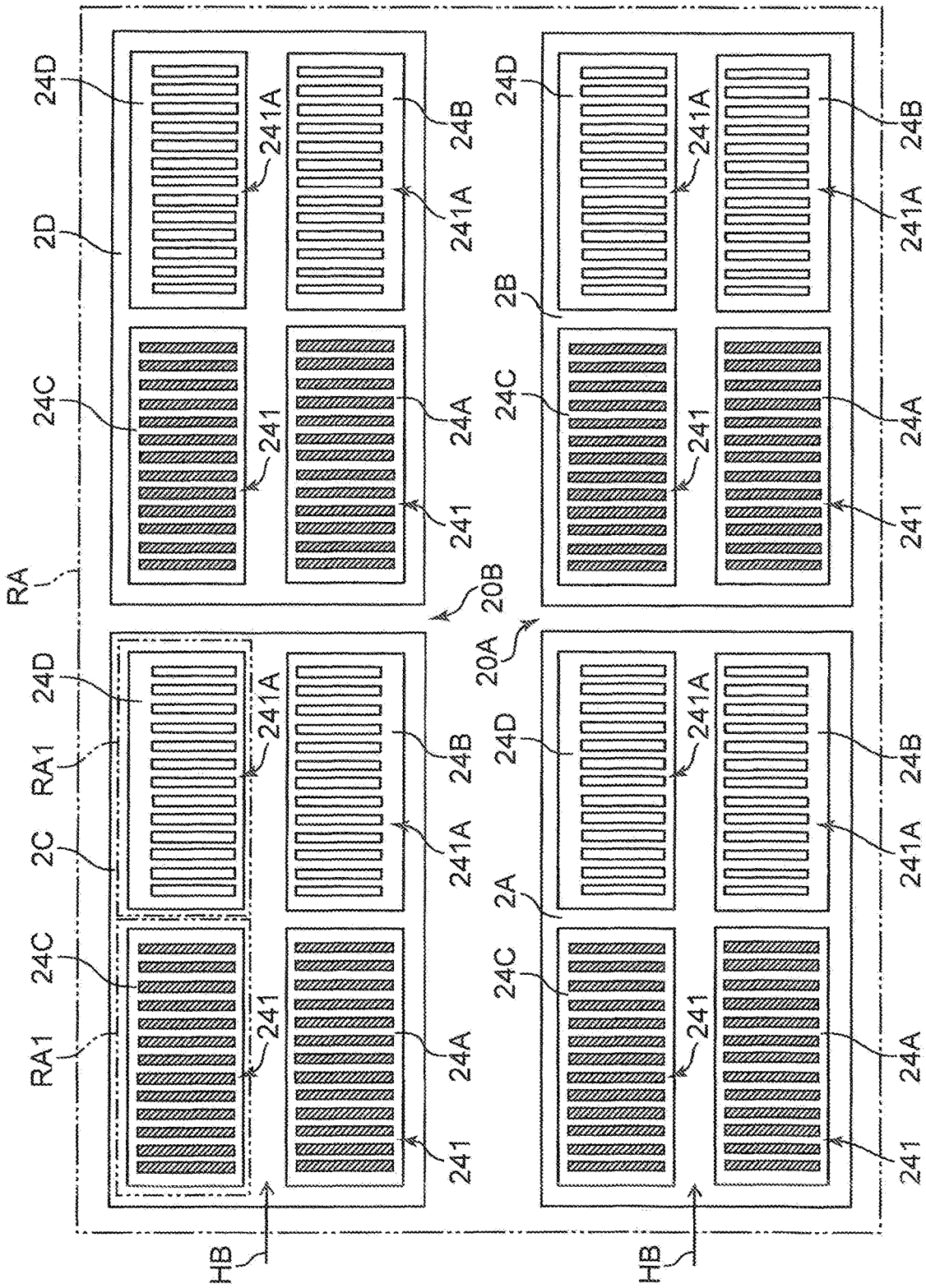
FIG. 11 is a diagram for describing a second example of the tape feeder arrangement state set by the second setting unit of the feeder arrangement setting unit.
Figure 12:
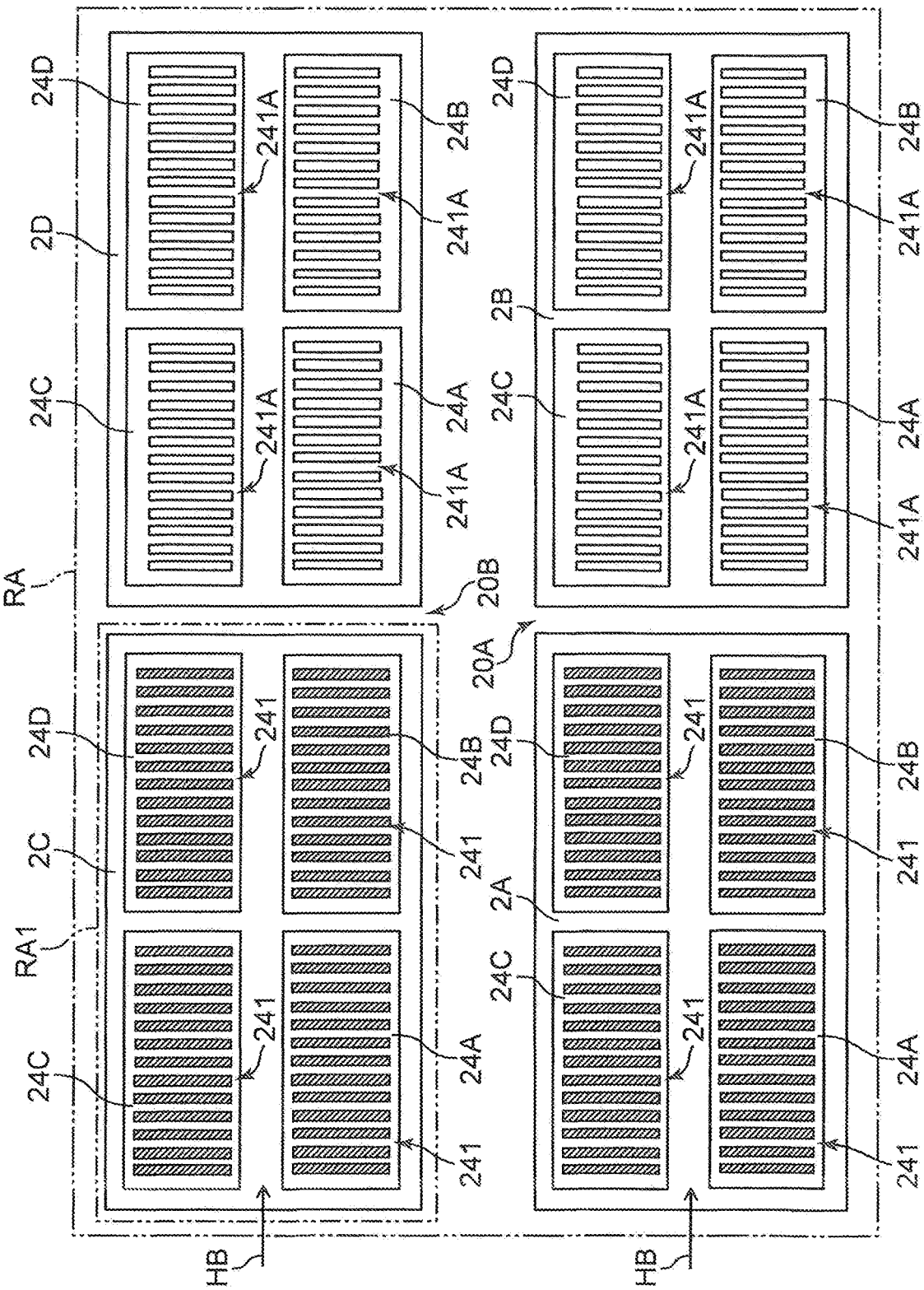
FIG. 12 is a diagram for describing a third example of the tape feeder arrangement state set by the second setting unit of the feeder arrangement setting unit.
Figure 13:
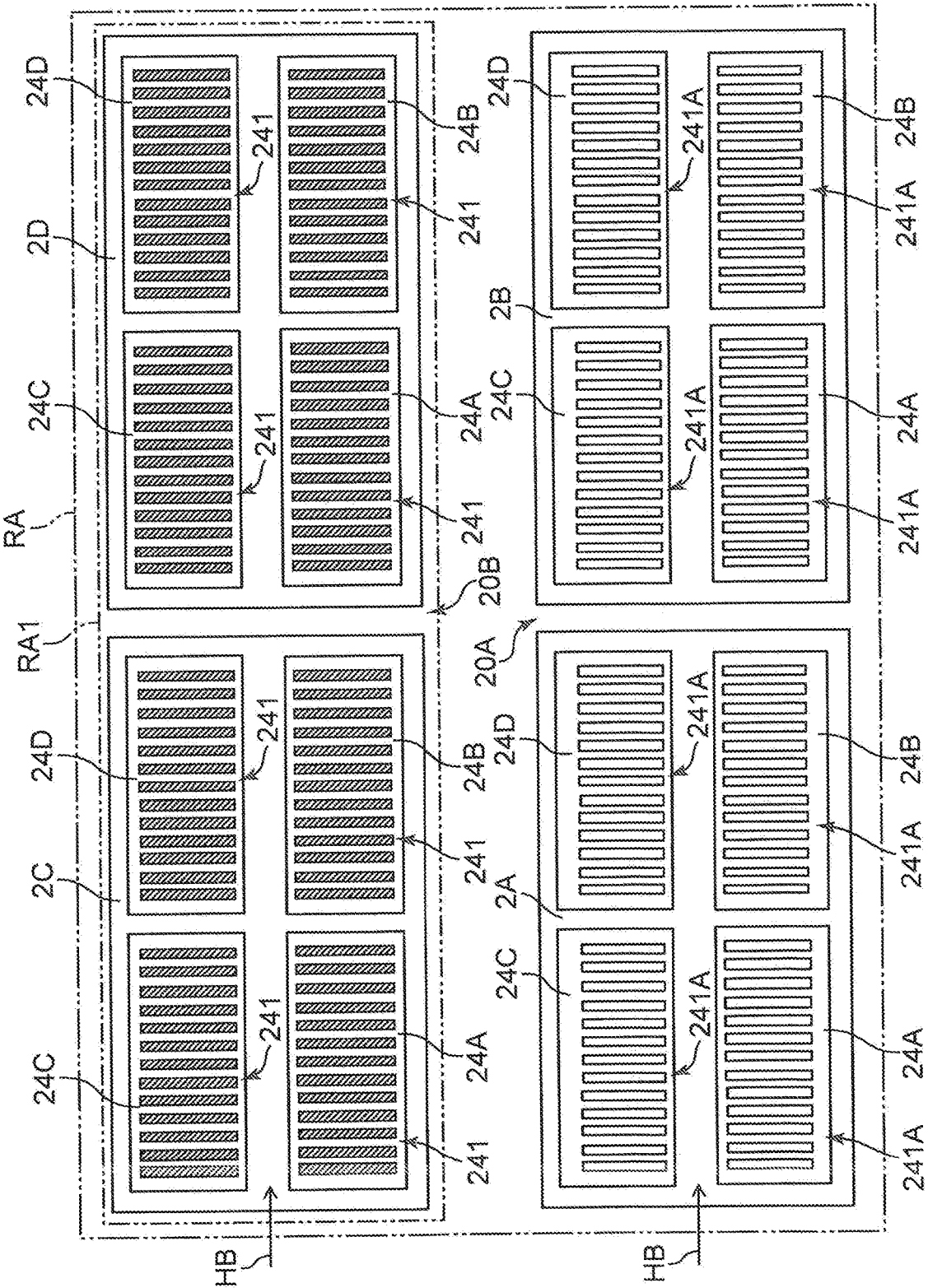
FIG. 13 is a diagram for describing a fourth example of the tape feeder arrangement state set by the second setting unit of the feeder arrangement setting unit.
Figure 14:
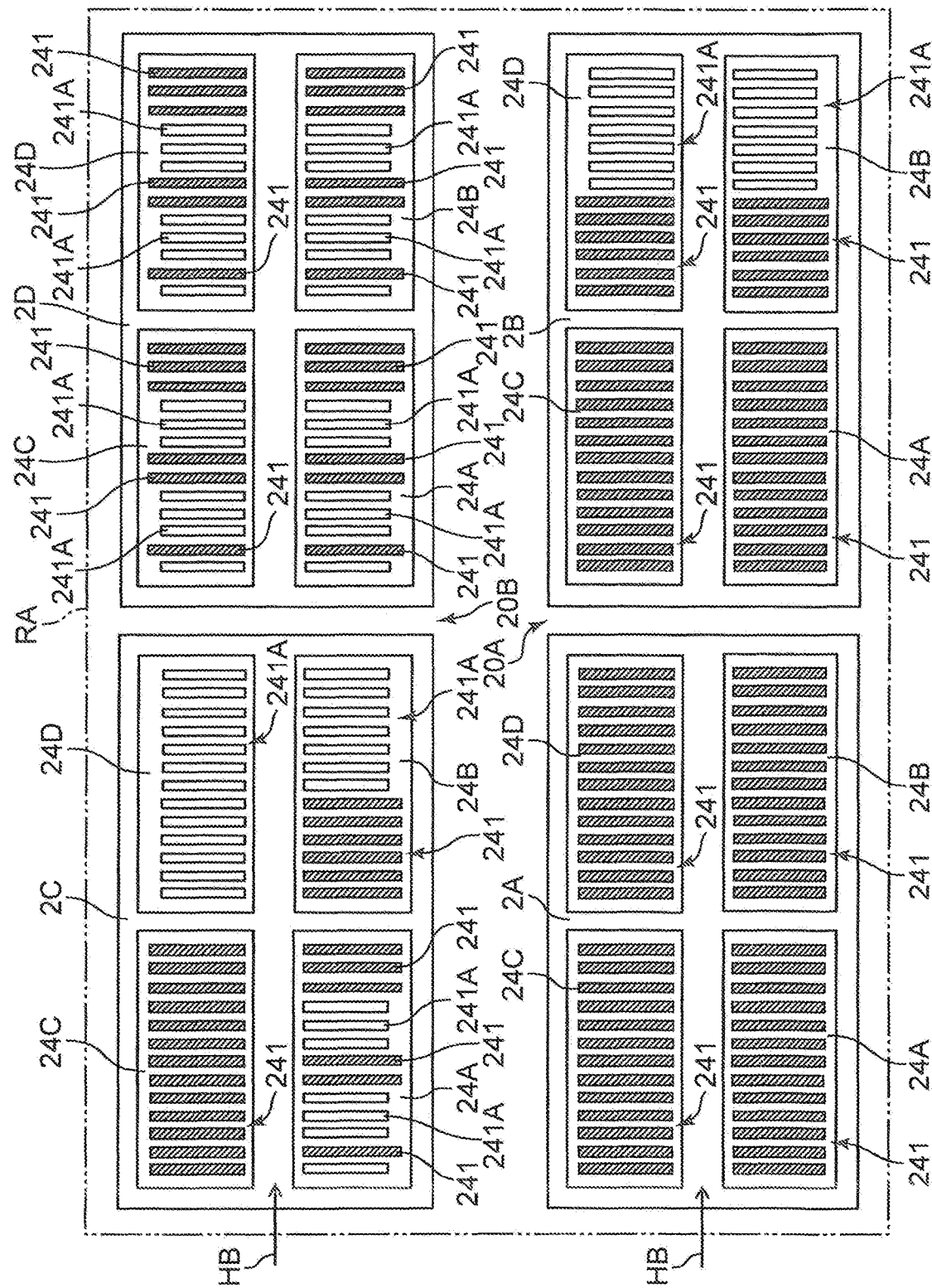
FIG. 14 is a diagram for describing a fifth example of the tape feeder arrangement state set by the second setting unit of the feeder arrangement setting unit.

The second setting unit 3462 of the feeder arrangement setting unit 346 will then be described with reference to FIGS. 10 to 14. FIGS. 10 to 14 are diagrams for describing examples of tape feeder arrangement states set by the second setting unit 3462. FIG. 10 depicts a first example, FIG. 11 depicts a second example, FIG. 12 depicts a third example, FIG. 13 depicts a fourth example, and FIG. 14 depicts a fifth example.

When tape feeders 241 and 214A different in method of supplying the component storage tape 245 are present together in the component feeding units 24A, 24B, 24C, and 24D of the component-mounting device 2, the operator may become confused when carrying out pre-arrangement work and component supply work on each of the tape feeders 241 and 214A. To avoid such a case, the operation unit 32 is configured to receive input of a second arrangement specifying instruction to specify arrangement that takes account of the method of supplying the component storage tape 245 to the tape feeder. When the second arrangement specifying instruction is input to the operation unit 32, the second setting unit 3462 sets tape feeder arrangement that follows the second arrangement specifying instruction. More specifically, the second setting unit 3462 specifies a setting target area RA in which arrangement of tape feeders are set, segments the setting target area RA into a plurality of areas, and arranges first tape feeders 241 operating according to the first supply method or second tape feeders 241A operating according to the second supply method consecutively in a row in one segmented area RA1. As a result, tape feeders operating according to the same supply method are arranged in a row in the one segmented area RA1. This provides tape feeder arrangement that allows the operator to smoothly carry out pre-arrangement work and component supply work.

As described above, the first tape feeder 241 operating according to the first supply method is configured to be fitted with a plurality of component storage tapes 245, and allows "collective supply" of collectively carrying out component supply work to supply new component storage tapes (reels) respectively to a plurality of first tape feeders 241 at the same point of time. The second setting unit 3462 arranges first tape feeders 241 operating according to the first supply method, the first tape feeders 241 allowing "collective supply", consecutively in a row in the one segmented area RA1. This reduces the frequency of the operator's coming to the component-mounting device, thus reducing the operator's burden resulting from component supply work.

According to this embodiment, in the setting target area RA specified by the second setting unit 3462, a plurality of production lines 20A and 20B for producing component-mounting boards are arranged. In the examples shown in FIGS. 10 to 14, two production lines, i.e., the first production line 20A and the second production line 20B are arranged in the setting target area RA. On the first production line 20A, two component-mounting devices 2A and 2B are arranged in a row along a board transfer direction HB, i.e., a direction of transferring the board. On the first production line 20A, a component-mounting device located on the upstream side in the board transfer direction HB is referred to as first component-mounting device 2A, while a component-mounting device located on the downstream side is referred to as second component-mounting device 2B. On the second production line 20B, two component-mounting devices 2C and 2D are arranged in a row along the board transfer direction HB. On the second production line 20B, a component-mounting device located on the upstream side in the board transfer direction HB is referred to as third component-mounting device 2C, while a component-mounting device located on the downstream side is referred to as fourth component-mounting device 2D. The first to fourth component-mounting devices 2A, 2B, 2C, and 2D each have four component feeding units 24A, 24B, 24C, and 24D. The component feeding unit 24A and the component feeding unit 24B are arranged in a row along the board transfer direction HB such that the component feeding unit 24A is on the upstream side while the component feeding unit 24B is on the downstream side. The component feeding unit 24C and the component feeding unit 24D are arranged in a row along the board transfer direction HB such that the component feeding unit 24C and the component feeding unit 24D are counter to the component feeding unit 24A and the component feeding unit 24B, respectively, and that the component feeding unit 24C is on the upstream side while the component feeding unit 24D is on the downstream side.

When segmenting the setting target area RA into the plurality of areas, the second setting unit 3462 can adopt various forms of segmentation.

A first form of segmentation will first be described with reference to FIG. 10. In the example of FIG. 10, the second setting unit 3462 segments the setting target area RA such that a partial area of each of the component feeding units 24A, 24B, 24C, and 24D making up each of the first to fourth component-mounting devices 2A, 2B, 2C, and 2D is defined as the one segmented area RA1. In this case, each of the component feeding units 24A, 24B, 24C, and 24D making up each of the first to fourth component-mounting devices 2A, 2B, 2C, and 2D is segmented into an area in which first tape feeders 241 operating according to the first supply method are arranged consecutively in a row and an area in which second tape feeders 241A operating according to the second supply method are arranged consecutively in a row.

A second form of segmentation will then be described with reference to FIG. 11. In the example of FIG. 11, the second setting unit 3462 segments the setting target area RA such that the entire area of each of the component feeding units 24A, 24B, 24C, and 24D making up each of the first to fourth component-mounting devices 2A, 2B, 2C, and 2D is defined as the one segmented area RA1. In this case, each of the first to fourth component-mounting devices 2A, 2B, 2C, and 2D is made up of component feeding units in each of which first tape feeders 241 operating according to the first supply method are arranged in a row and component feeding units in each of which second tape feeders 241A operating according to the second supply method are arranged in a row. In FIG. 11, in each of the first to fourth component-mounting devices 2A, 2B, 2C, and 2D, first tape feeders 241 operating according to the first supply method are arranged in a row in each of the component feeding units 24A and 24C located on the upstream side in the board transfer direction HB, while second tape feeders 241A operating according to the second supply method are arranged in a row in each of the component feeding units 24B and 24D located on the downstream side in the board transfer direction HB.

A third form of segmentation will then be described with reference to FIG. 12. In the example of FIG. 12, the second setting unit 3462 segments the setting target area RA such that each of the first to fourth component-mounting devices 2A, 2B, 2C, and 2D, the component-mounting devices 2A and 2B being on the first production line 20A and the component-mounting devices 2C and 2D being on the second production line 20B, is defined as the one segmented area RA1. In this case, each of the first and second production lines 20A and 20B is provided with the component-mounting device having the component feeding units in each of which first tape feeders 241 operating according to the first supply method are arranged in a row and with the component-mounting device having the component feeding units in each of which second tape feeders 241A operating according to the second supply method are arranged in a row. In FIG. 12, on the first production line 20A, first tape feeders 241 operating according to the first supply method are arranged in a row in each of the component feeding units 24A, 24B, 24C, and 24D making up the first component-mounting device 2A located on the upstream side in the board transfer direction HB, while second tape feeders 241A operating according to the second supply method are arranged in a row in each of the component feeding units 24A, 24B, 24C, and 24D making up the second component-mounting device 2B located on the downstream side in the board transfer direction HB. Likewise, on the second production line 20B, first tape feeders 241 operating according to the first supply method are arranged in a row in each of the component feeding units 24A, 24B, 24C, and 24D making up the third component-mounting device 2C located on the upstream side in the board transfer direction HB, while second tape feeders 241A operating according to the second supply method are arranged in a row in each of the component feeding units 24A, 24B, 24C, and 24D making up the fourth component-mounting device 2D located on the downstream side in the board transfer direction HB.

A fourth form of segmentation will then be described with reference to FIG. 13. In the example of FIG. 13, the second setting unit 3462 segments the setting target area RA such that each of the first and second production lines 20A and 20B is defined as the one segmented area RA1. In this case, the component-mounting system 1 includes the production line provided with a plurality of the component-mounting devices each having the component feeding units in each of which first tape feeders 241 operating according to the first supply method are arranged in a row, and the production line provided with a plurality of the component-mounting devices each having the component feeding units in each of which second tape feeders 241A operating according to the second supply method are arranged in a row. In FIG. 13, second tape feeders 241A operating according to the second supply method are arranged in a row in each of the component feeding units 24A, 24B, 24C, and 24D of the first and second component-mounting devices 2A and 2B arranged on the first production line 20A, while first tape feeders 241 operating according to the first supply method are arranged in a row in each of the component feeding units 24A, 24B, 24C, and 24D of the third and fourth component-mounting devices 2C and 2D arranged on the second production line 20B.

The second arrangement specifying instruction for causing the second setting unit 3462 to operate, the second arrangement specifying instruction being input to the operation unit 32, may be an instruction including feeder type specifying information added thereto, the feeder type specifying information specifying, for each segmented area RA1, either tape feeders 241 operating according to the first supply method or tape feeders 241A operating according to the second supply method, as tape feeders to be arranged in a row. When the second arrangement specifying instruction including the feeder type specifying information added thereto is input to the operation unit 32, the second setting unit 3462 arranges, in a row in each segmented area RA1, tape feeders 241 operating according to the first supply method or tape feeders 241A operating according to the second supply method according to the feeder type specifying information. In this configuration, the operator is allowed to specify the supply method for the tape feeders to be arranged in a row in each segmented area RA1, using the operation unit 32. Hence, arrangement of the plurality of tape feeders 241 and 241A can be set such that tape feeders operating according to the supply method specified by the operator are arranged in a row in the one segmented area RA1.

In the process of producing the component-mounting board, mounting relatively large components first and then mounting small components may lead to a deterioration in the mountability of those small components. To prevent such a case, on the first production line 20A on which the first and second component-mounting devices 2A and 2B are arranged in a row in the board transfer direction HB and on the second production line 20B on which the third and fourth component-mounting devices 2C and 2D are arranged in a row in the board transfer direction HB, it is preferable that the component-mounting device located on the upstream side in the board transfer direction HB mounts a large amount of small components on the board. In this case, tape feeders arranged in a row in each of the component feeding units 24A, 24B, 24C, and 24D of the first and third component-mounting devices 2A and 2C, which are located on the upstream side in the board transfer direction HB, feed a large amount of small components. At tape feeders that feed a large amount of small components, the frequency of component supply work increases with an increase in components to feed.

To avoid such a case, the second arrangement specifying instruction for causing the second setting unit 3462 to operate, the second arrangement specifying instruction being input to the operation unit 32, may be an instruction including intensive arrangement specifying information added thereto, the intensive arrangement specifying information being used for intensively arranging first tape feeders 241 operating according to the first supply method on the upstream side in the board transfer direction HB. When the second arrangement specifying instruction including the intensive arrangement specifying information added thereto is input to the operation unit 32, the second setting unit 3462 arranges, in priority, first tape feeders 241 operating according to the first supply method in a row in the component feeding units of the component-mounting devices located on the upstream side in the board transfer direction HB in the setting target area RA. A tape feeder arrangement state that results in this case is shown in FIG. 12. In FIG. 12, on the first production line 20A, first tape feeders 241 operating according to the first supply method are arranged intensively in a row in each of the component feeding units 24A, 24B, 24C, and 24D of the first component-mounting device 2A located on the upstream side in the board transfer direction HB. Likewise, on the second production line 20B, first tape feeders 241 operating according to the first supply method are arranged intensively in a row in each of the component feeding units 24A, 24B, 24C, and 24D of the third component-mounting device 2C located on the upstream side in the board transfer direction HB.

The first tape feeder 241 operating according to the first supply method is the tape feeder at which component supply work is easier than component supply work at the second tape feeder 241A operating according to the second supply method. For this reason, even if the frequency of component supply work increases with an increase in components to feed, the operator is able to carry out component supply work without difficulty at the first tape feeder 241 operating according to the first supply method.

The operation unit 32 may be configured such that the first arrangement specifying instruction or the second arrangement specifying instruction can be input to the operation unit 32 separately for each of the component feeding units 24A, 24B, 24C, and 24D making up each of the first to fourth component-mounting devices 2A, 2B, 2C, and 2D. Following an instruction input to the operation unit 32, the first setting unit 3461 and the second setting unit 3462 thus separately set tape feeder arrangement in each of the component feeding units 24A, 24B, 24C, and 24D making up each of the first to fourth component-mounting devices 2A, 2B, 2C, and 2D. A tape feeder arrangement state that results in this case is shown in FIG. 14.

In FIG. 14, for each of the component feeding units 24A, 24B, 24C, and 24D of the first and second component-mounting devices 2A and 2B on the first production line 20A, the second arrangement specifying instruction including intensive arrangement specifying information added thereto is input. Following this instruction, on the first production line 20A, the second setting unit 3462 intensively arranges first tape feeders 241 operating according to the first supply method in a row in each of the component feeding units 24A, 24B, 24C, and 24D of the first component-mounting device 2A located on the upstream side in the board transfer direction HB. On the first production line 20A, the second setting unit 3462 also intensively arranges first tape feeders 241 operating according to the first supply method in a row in each of the component feeding units 24A and 24C of the second component-mounting device 2B located on the downstream side in the board transfer direction HB, the component feeding units 24A and 24C being located on the upstream side in the second component-mounting device 2B. In addition, the second setting unit 3462 segments each of the component feeding units 24B and 24D located on the downstream side in the second component-mounting device 2B into an upstream side area in which first tape feeders 241 operating according to the first supply method are arranged consecutively in a row and a downstream side area in which second tape feeders 241A operating according to the second supply method are arranged consecutively in a row.

In FIG. 14, in the third component-mounting device 2C on the second production line 20B, the first arrangement specifying instruction is input for the component feeding unit 24A, the second arrangement specifying instruction is input for the component feeding unit 24B, and the second arrangement specifying instruction including intensive arrangement specifying information added thereto is input for the component feeding units 24C and 24D. Thus, following the first arrangement specifying instruction input for the component feeding unit 24A of the third component-mounting device 2C, the first setting unit 3461 sets arrangement of a plurality of tape feeders 241 and 241A in the component feeding unit 24A such that the given reference number of more of second tape feeders 241A operating according to the second supply method, i.e., special type feeders are arranged consecutively in a row in an area of the component feeding unit 24A, the area being defined by excluding at least both ends of the component feeding unit 24A in the direction of arrangement in a row (X-axis direction). Following the second arrangement specifying instruction input for the component feeding unit 24B of the third component-mounting device 2C, the second setting unit 3462 segments the component feeding unit 24B into an upstream side area in which first tape feeders 241 operating according to the first supply method are arranged consecutively in a row and a downstream side area in which second tape feeders 241A operating according to the second supply method are arranged consecutively in a row. Following the second arrangement specifying instruction including intensive arrangement specifying information added thereto, the second arrangement specifying instruction being input for the component feeding units 24C and 24D of the third component-mounting device 2C, the second setting unit 3462 arranges first tape feeders 241 operating according to the first supply method in a row in the component feeding unit 24C located on the upstream side in the board transfer direction HB while arranges second tape feeders 241A operating according to the second supply method in a row in the component feeding unit 24D located on the downstream side in the board transfer direction HB.

In FIG. 14, for each of the component feeding units 24A, 24B, 24C, and 24D of the fourth component-mounting device 2D on the second production line 20B, the first arrangement specifying instruction is input. Thus, following this first arrangement specifying instruction, the first setting unit 3461 sets arrangement of a plurality of tape feeders 241 and 241A in each of the component feeding units 24A, 24B, 24C, and 24D of the fourth component-mounting device 2D such that the given reference number of more of second tape feeders 241A operating according to the second supply method, i.e., special type feeders are arranged in a row in an area of each component feeding unit, the area being defined by excluding at least both ends of the component feeding unit in the direction of arrangement in a row (X-axis direction).

Figure 15:
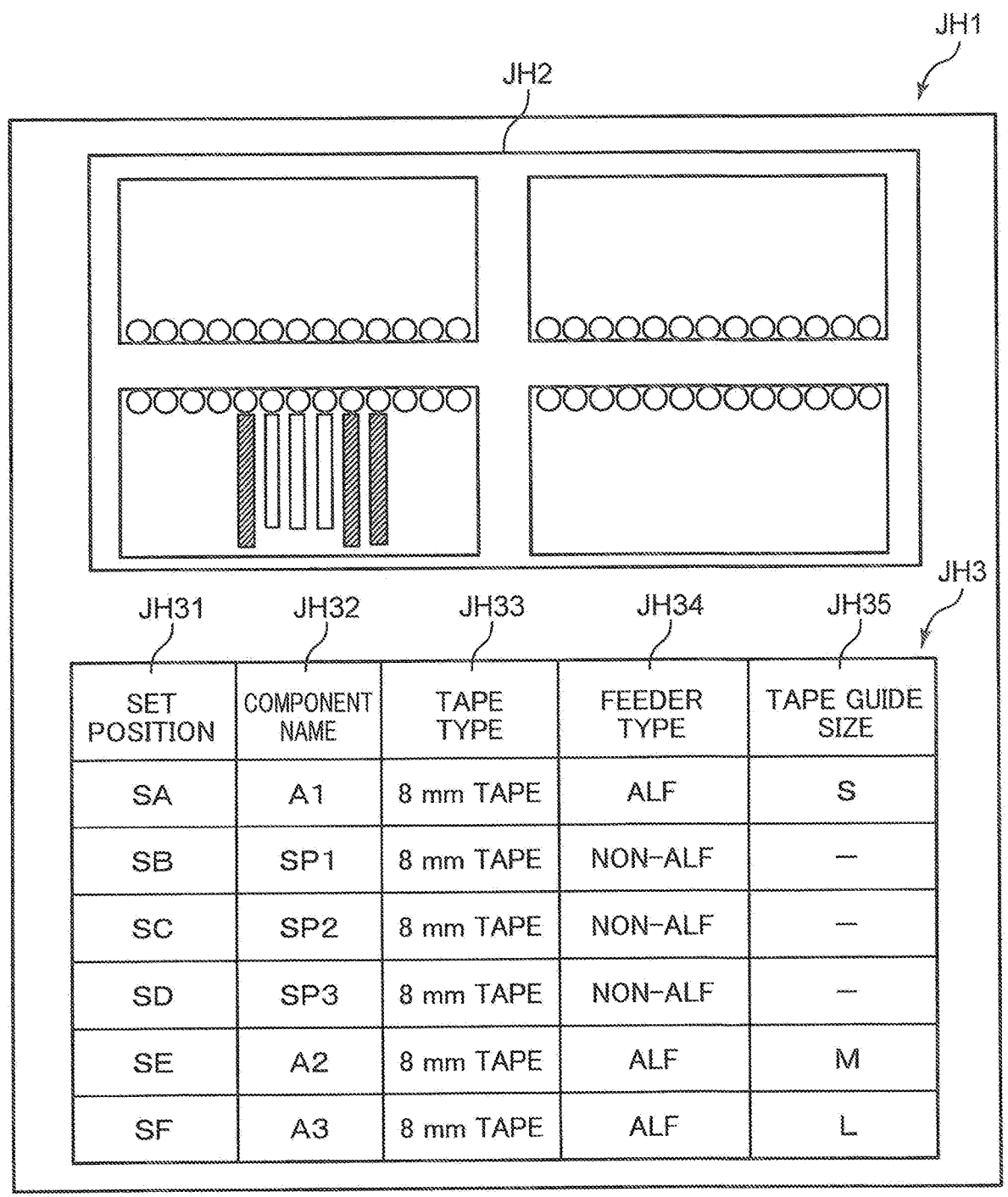
FIG. 15 is a diagram for describing arrangement setting information created by the feeder arrangement setting unit.

According to this embodiment, each of the first setting unit 3461, the second setting unit 3462, and the third setting unit 3463 that make up the feeder arrangement setting unit 346 creates a piece of arrangement setting information indicating a result of setting of tape feeder arrangement. Pieces of arrangement setting information created respectively by the first setting unit 3461, the second setting unit 3462, and the third setting unit 3463 that make up the feeder arrangement setting unit 346 are shown in FIG. 15. FIG. 15 is a diagram for describing arrangement setting information JH1 created by the feeder arrangement setting unit 346.

The arrangement setting information JH1 shown in FIG. 15 includes feeder set information JH2 and feeder arrangement related information JH3. The feeder set information JH2 is information diagrammatically showing a tape feeder arrangement state in each of the component feeding units 24A, 24B, 24C, and 24D of the component-mounting device 2. The feeder arrangement related information JJH3 is information composed of set position information (set position) JH31, component type information (component name) JH32, tape type information (tape type) JH33, feeder type information (feeder type) JH34, and tape guide size information (tape guide size) JH35 that are associated with each other. The set position information JH31 is information indicating a set position defined for each component in the component feeding units 24A, 24B, 24C, and 24D. The component type information JH32 is information on the type of components stored in the component storage tape 245. The tape type information JH33 is information indicating the type of the component storage tape 245. The feeder type information JH34 is information indicating the type of the tape feeder. In the feeder type information JH34, when two tape feeder types, i.e., "ALF" representing the first tape feeder 241 and "non-ALF" representing the second tape feeder 241A exist, information entry may be made such that only the "ALF" is entered as a space for entering and "non-ALF" is left blank. The tape guide size information JH35 is information on the size of the tape guide 244 included in the first tape feeder 241 operating according to the first supply method.

The arrangement setting information JH1 shown in FIG. 15 demonstrates that a first tape feeder 241 whose feeder tape is indicated as "ALF" by the feeder type information JH34 is set at a set position "SA" indicated by the set position information JH31. This first tape feeder 241 of the feeder type "ALF" that is set at the set position "SA" has a tape guide 244 whose size is indicated as "S" by the tape guide size information JH35. The first tape feeder 241 of the feeder type "ALF" that is set at the set position "SA" is fitted with a component storage tape 245 whose type is indicated as "8 mm tape" by the tape type information JH33 and which carries components whose type is indicated as "A1" by the component type information JH32.

The arrangement setting information JH1 demonstrates also that a second tape feeder 241A whose feeder tape is indicated as "non-ALF" by the feeder type information JH34 is set at a set position "SB" indicated by the set position information JH31. This second tape feeder 241A of the feeder type "non-ALF" that is set at the set position "SB" is fitted with a component storage tape 245 whose type is indicated as "8 mm tape" by the tape type information JH33 and which carries components whose type is indicated as "SP1" by the component type information JH32.

The arrangement setting information JH1 demonstrates also that a second tape feeder 241A whose feeder tape is indicated as "non-ALF" by the feeder type information JH34 is set at a set position "SC" indicated by the set position information JH31. This second tape feeder 241A of the feeder type "non-ALF" that is set at the set position "SC" is fitted with a component storage tape 245 whose type is indicated as "8 mm tape" by the tape type information JH33 and which carries components whose type is indicated as "SP2" by the component type information JH32.

The arrangement setting information JH1 demonstrates also that a second tape feeder 241A whose feeder tape is indicated as "non-ALF" by the feeder type information JH34 is set at a set position "SD" indicated by the set position information JH31. This second tape feeder 241A of the feeder type "non-ALF" that is set at the set position "SD" is fitted with a component storage tape 245 whose type is indicated as "8 mm tape" by the tape type information JH33 and which carries components whose type is indicated as "SP3" by the component type information JH32.

The arrangement setting information JH1 demonstrates also that a first tape feeder 241 whose feeder tape is indicated as "ALF" by the feeder type information JH34 is set at a set position "SE" indicated by the set position information JH31. This first tape feeder 241 of the feeder type "ALF" that is set at the set position "SE" has a tape guide 244 whose size is indicated as "M" by the tape guide size information JH35. The first tape feeder 241 of the feeder type "ALF" that is set at the set position "SE" is fitted with a component storage tape 245 whose type is indicated as "8 mm tape" by the tape type information JH33 and which carries components whose type is indicated as "A2" by the component type information JH32.

The arrangement setting information JH1 demonstrates also that a first tape feeder 241 whose feeder tape is indicated as "ALF" by the feeder type information JH34 is set at a set position "SE" indicated by the set position information JH31. This first tape feeder 241 of the feeder type "ALF" that is set at the set position "SF" has a tape guide 244 whose size is indicated as "L" by the tape guide size information JH35. The first tape feeder 241 of the feeder type "ALF" that is set at the set position "SF" is fitted with a component storage tape 245 whose type is indicated as "8 mm tape" by the tape type information JH33 and which carries components whose type is indicated as "A3" by the component type information JH32.

According to this embodiment, the display unit 33 of the feeder management device 3 may be configured to display the arrangement setting information JH1 created by each of the first setting unit 3461, the second setting unit 3462, and the third setting unit 3463. The operator is thus able to carry out tape feeder pre-arrangement work, referring to the arrangement setting information JH1 displayed by the display unit 33.

The component-mounting system according to this embodiment includes the feeder management device 3 that in a state in which various first tape feeders 241 and second tape feeders 214A different in shape and in method of supplying the component storage tape 245 are present together, manages arrangement of the tape feeders that allows the operator to smoothly carry out pre-arrangement work and component supply work. As a result, a case where component feeding from the tape feeders 241 and 241A stops due to a delay in pre-arrangement work and component supply work can be prevented. Hence, a drop in the efficiency of production of the component-mounting board can be prevented.

The above specific embodiment mainly includes aspects of the disclosure that offer various configurations in the following manner.

A feeder management device according to one aspect of the present disclosure is a device that manages arrangement of a plurality of tape feeders in a component feeding unit, the plurality of tape feeders being arranged in a row in the component feeding unit of a component-mounting device that mounts components on a board to produce a component-mounting board and feeding a component storage tape carrying components to feed the components. The feeder management device include a feeder classifying unit that classifies the plurality of tape feeders into a plurality of types of tape feeders, based on a classification index on a shape or on a method of supplying the component storage tape, the classification index being an index for classifying the plurality of tape feeders; an input unit that receives input of an instruction on setting of arrangement of the plurality of tape feeders; and a feeder arrangement setting unit that, referring to the instruction input to the input unit, sets arrangement of the plurality of tape feeders according to classification made by the feeder classifying unit. The feeder arrangement setting unit includes a first setting unit that extracts a special type feeder classified as a tape feeder of a special type by the feeder classifying unit and that sets arrangement of the plurality of tape feeders such that a given reference number or more of the special type feeders are arranged consecutively in a row in an area of the component feeding unit, the area being defined by at least excluding both ends of the component feeding unit in a direction of the arrangement in a row.

In a state in which various tape feeders different in shape and in method of supplying the component storage tape are present together, this feeder management device manages arrangement of tape feeders in the component feeding unit of the component-mounting device. If arrangement of the tape feeders in the component feeding unit is determined to be ordinary arrangement that gives priority to the efficiency of production of the component-mounting board, it may lead to impairment of the smoothness of an operator's tape feeder arrangement work and component supply work. To prevent such a case, the feeder management device includes a feeder classifying unit and a feeder arrangement setting unit. The feeder classifying unit classifies a plurality of tape feeders to be arranged in the component feeding unit into a plurality of types of tape feeders, based on the classification index on the shape or the method of supplying the component storage tape. The first setting unit of the feeder arrangement setting unit extracts a special type feeder according to classification of tape feeders made by the feeder classifying unit, and sets arrangement of a plurality of tape feeders in the component feeding unit such that the given reference number or more of the special tape feeders are arranged consecutively in a row. This provides tape feeder arrangement that in a state in which various tape feeders different in shape and in method of supplying the component storage tape are present together, allows the operator to smoothly carry out pre-arrangement work and component supply work. As a result, a case where component feeding from the tape feeder stops due to a delay in pre-arrangement work and component supply work and the efficiency of production of the component-mounting board drops as a consequence can be prevented as much as possible.

In the above feeder management device, the input unit is configured to receive input of an instruction to specify the given reference number.

In this aspect, the operator is allowed to specify the reference number representing the number of special type feeders arranged consecutively in a row in the component feeding unit, using the input unit. Hence, arrangement of the plurality of tape feeders in the component feeding unit can be set such that the reference number or more of special type feeders, the reference number being specified by the operator, are arranged consecutively in a row.

In the tape feeder management device, the feeder classifying unit is configured to use the longitudinal length of the tape feeder along the direction of feeding the component storage tape, as the classification index on the shape and to classify the plurality of tape feeders into tape feeders having a first longitudinal length and tape feeders having a second longitudinal length shorter than the first longitudinal length. The input unit is configured to receive input of a first arrangement specifying instruction to specify arrangement that takes account of the shape of the tape feeder. When the first arrangement specifying instruction is input to the input unit, the first setting unit extracts a tape feeder having the second longitudinal length that is classified as the special type feeder by the feeder classifying unit.

In the component feeding unit, if a tape feeder having the second longitudinal length shorter than the first longitudinal length is located between tape feeders having the first longitudinal length, pre-arrangement work and component supply work, which includes inserting and pulling the tape feeder having the second longitudinal length in and out of the component feeding unit, may become difficult. To prevent such a case, when the first arrangement specifying instruction to specify arrangement that takes account of the shape of the tape feeder is input to the input unit, the first setting unit of the feeder arrangement setting unit sets tape feeder arrangement that follows the first arrangement specifying instruction. More specifically, the first setting unit extracts a tape feeder having the second longitudinal length, as a special type feeder, and sets arrangement of a plurality of tape feeders in the component feeding unit such that the reference number or more of the tape feeders having the second longitudinal length are arranged consecutively in a row. As a result, even when a second tape feeder having the second longitudinal length is located between first tape feeders having the first longitudinal length, a work space for carrying out pre-arrangement work and component supply work, which includes inserting and pulling the tape feeder having the second longitudinal length in and out of the component feeding unit, can be secured. This provides tape feeder arrangement that in a state in which various tape feeders different in shape are present together, allows the operator to smoothly carry out pre-arrangement work and component supply work.

In the above feeder management device, the plurality of tape feeders includes a tape feeder operating according to a first supply method by which the tape feeder can be fitted with a plurality of component storage tapes that are a preceding component storage tape that feeds components first and a component storage tape for replenishment that feeds components subsequently; and a tape feeder operating according to a second supply method by which the component storage tape for replenishment is spliced to a rear end of the preceding component storage tape.

In the above feeder management device, the longitudinal length of the tape feeder operating according to the second supply method is determined to be shorter than the longitudinal length of the tape feeder operating according to the first supply method. When a method of supplying the component storage tape is used as the classification index, the feeder classifying unit classifies the tape feeder operating according to the first supply method as the tape feeder having the first longitudinal length and classifies the tape feeder operating according to the second supply method as the tape feeder having the second longitudinal length.

In this aspect, when component storage tapes having the same width are used respectively at the tape feeder operating according to the first supply method and the tape feeder operating according to the second supply method, the longitudinal length of the tape feeder operating according to the second supply method is determined to be shorter than that of the tape feeder operating according to the first supply method. In other words, when the tape feeder operating according to the first supply method and the tape feeder operating according to the second supply method are classified by paying attention to their longitudinal lengths, the tape feeder operating according to the first supply method is classified as the tape feeder having the first longitudinal length while the second tape feeder operating according to the second supply method is classified as the tape feeder having the second longitudinal length. In this case, the first setting unit of the feeder arrangement setting unit extracts a tape feeder having the second longitudinal length and operating according to the second supply method, as a special type feeder, and sets arrangement of a plurality of tape feeders in the component feeding unit such that the reference number or more of the tape feeders operating according to the second supply method are arranged consecutively in a row. As a result, even when a tape feeder having the second longitudinal length, i.e., shorter longitudinal length and operating according to the second supply method is located between first tape feeders having the first longitudinal length and operating according to the first supply method, a work space for carrying out pre-arrangement work and component supply work, which includes inserting and pulling the tape feeder having the second longitudinal length in and out of the component feeding unit, can be secured. This provides tape feeder arrangement that allows the operator to smoothly carry out pre-arrangement work and component supply work.

In the above feeder management device, the input unit is configured to receive input of a second arrangement specifying instruction to specify arrangement that takes account of a method of supplying the component storage tape to the tape feeder. The feeder arrangement setting unit includes a second setting unit that sets arrangement of the plurality of tape feeders, based on the second arrangement specifying instruction. The second setting unit specifies a setting target area in which arrangement of the plurality of tape feeders is set, segments the setting target area into a plurality of areas, and arranges the tape feeders operating according to the first supply method or the tape feeders operating according to the second supply method consecutively in a row in one segmented area.

When tape feeders different in method of supplying the component storage tape are present together in the component feeding unit, the operator may become confused when carrying out pre-arrangement work and component supply work on each of the tape feeders. To prevent such a case, when the second arrangement specifying instruction to specify arrangement that takes account of the method of supplying the component storage tape is input to the input unit, the second setting unit of the feeder arrangement setting unit sets tape feeder arrangement that follows the second arrangement specifying instruction. More specifically, the second setting unit specifies the setting target area in which arrangement of tape feeders are set, segments the setting target area into the plurality of areas, and arranges the tape feeders operating according to the first supply method or the tape feeders operating according to the second supply method consecutively in a row in one segmented area. As a result, tape feeders operating according to the same supply method are arranged in a row in the one segmented area. This provides tape feeder arrangement that allows the operator to smoothly carry out pre-arrangement work and component supply work.

The tape feeder operating according to the first supply method is the tape feeder that can be fitted with a plurality of component storage tapes, i.e., a preceding component storage tape and a following component storage tape for replenishment. In the case of the tape feeder operating according to the first supply method configured in such a manner, a time zone between a point of time at which the preceding component storage tape runs out of components to feed and a point of time at which the following component storage tape runs out of components to feed is a supply time zone in which a new component storage tape can be supplied. This means that the tape feeder operating according to the first supply method allows choosing a proper point of time to supply a new component storage tape within the supply time zone, thus giving a high degree of freedom in supplying a new component storage tape. If respective supply time zones of a plurality of tape feeders operating according to the first supply method overlap to create an overlapping supply time zone, new component storage tapes can be supplied to the tape feeders operating according to the first supply method, respectively, at the same point of time within the overlapping supply time zone. Specifically, "collective supply", which allows the operator to carry out component supply work collectively, can be performed at the tape feeders that can be supplied with component storage tapes, respectively, at the same point of time. The second setting unit of the feeder arrangement setting unit arranges the tape feeders operating according to the first supply method, which allows "collective supply", consecutively in a row in the one segmented area. This reduces the frequency of the operator's coming to the component-mounting device, thus reducing the operator's burden resulting from component supply work.

According to the above feeder arrangement device, a plurality of production lines for the component-mounting board, the production lines each including a plurality of the component-mounting devices that have the component feeding units and are arranged in a direction of transferring the board, are arranged in the setting target area. The second setting unit segments the setting target area to define any one of a partial area of the component feeding unit, the entire area of the component feeding unit, the component-mounting device, and the production line, as the one segmented area.

In this aspect, the second setting unit of the feeder arrangement setting unit defines any one of a partial area of the component feeding unit, the entire area of the component feeding unit, the component-mounting device, and the production line, as the one segmented area in which tape feeders operating according to the first supply method or tape feeders operating according to the second supply method are arranged consecutively in a row. In a case where a partial area of the component feeding unit is defined as the one segmented area, the component feeding unit is segmented into an area in which tape feeders operating according to the first supply method are arranged consecutively in a row and an area in which tape feeders operating according to the second supply method are arranged consecutively in a row. In a case where the entire area of the component feeding unit is defined as the one segmented area, the component-mounting device is made up of component feeding units in each of which first tape feeders operating according to the first supply method are arranged in a row and component feeding units in each of which second tape feeders operating according to the second supply method are arranged in a row. In a case where the component-mounting device is defined as the one segmented area, the production line is provided with a component-mounting device having component feeding units in each of which first tape feeders operating according to the first supply method are arranged in a row and with a component-mounting device having component feeding units in each of which second tape feeders operating according to the second supply method are arranged in a row. In a case where the production line is defined as the one segmented area, the component-mounting system includes a production line provided with a plurality of component-mounting devices each having component feeding units in each of which first tape feeders operating according to the first supply method are arranged in a row, and a production line provided with a plurality of component-mounting devices each having component feeding units in each of which second tape feeders operating according to the second supply method are arranged in a row.

According to the above feeder management device, the second arrangement specifying instruction includes an instruction to which feeder type specifying information is added, the feeder type specifying information being for specifying, for each one segmented area, either the tape feeders operating according to the first supply method or the tape feeders operating according to the second supply method, as tape feeders to be arranged in a row. When the second arrangement specifying instruction to which the feeder type specifying information is added is input to the input unit, the second setting unit arranges, in a row in each segmented area, either the tape feeders operating according to the first supply method or the tape feeders operating according to the second supply method that are specified according to the feeder type specifying information.

In this configuration, the operator is allowed to specify the supply method for the tape feeders to be arranged in a row in each segmented area, using the operation unit. Hence, arrangement of a plurality of tape feeders can be set such that the tape feeders operating according to the supply method specified by the operator are arranged in a row in the one segmented area.

According to the above feeder management device, the second arrangement specifying instruction includes an instruction to which intensive arrangement specifying information is added, the intensive arrangement specifying information being for intensively arranging tape feeders operating according to the first supply method on the upstream side in the board transfer direction. When the second arrangement specifying instruction to which the intensive arrangement specifying information is added is input to the input unit, the second setting unit preferentially arranges the first tape feeders operating according to the first supply method in a row in the component feeding unit of the component-mounting device located on the upstream side in the direction of transferring the board in the setting target area.

In the process of producing component-mounting boards, mounting relatively large components first and then mounting small components may lead to a deterioration in the mountability of those small components. To prevent such a case, on the production line on which a plurality of component-mounting devices are arranged in a row in the direction of transferring the board, it is preferable that a component-mounting device located on the upstream side in the direction of transferring the board mounts a large amount of small components on the board. In this case, tape feeders arranged in a row in each of the component feeding units of the component-mounting device located on the upstream side in the direction of transferring the board feed a large amount of small components. At tape feeders that feed a large amount of small components, the frequency of component supply work increases with an increase in components to feed. To avoid such a case, when the second arrangement specifying instruction including the intensive arrangement specifying information added thereto is input to the input unit, the second setting unit arranges, in priority, first tape feeders operating according to the first supply method in a row in the component feeding unit of the component-mounting device located on the upstream side in the direction of transferring the board. The first tape feeder operating according to the first supply method is the tape feeder at which component supply work is easier than component supply work at the second tape feeder operating according to the second supply method. For this reason, even if the frequency of component supply work increases with an increase in components to feed, the operator is able to carry out component supply work without difficulty at the first tape feeder operating according to the first supply method.

In the above feeder management device, the input unit is configured to receive input of a third arrangement specifying instruction to specify tape feeder arrangement that takes account of the efficiency of production of the component-mounting board by the component-mounting device. The feeder arrangement setting unit includes a third setting unit that sets arrangement of the plurality of tape feeders, based on the third arrangement specifying instruction.

In this aspect, when the third arrangement specifying instruction to specify the tape feeder arrangement that takes account of the efficiency of production of the component-mounting board is input to the input unit, the third setting unit of the feeder arrangement setting unit sets arrangement of the plurality of tape feeders, based on the third arrangement specifying instruction. This provides tape feeder arrangement that attaches great importance to the efficiency of production of the component-mounting board.

The above feeder management device further includes a display unit that displays arrangement setting information indicating a result of setting of tape feeder arrangement that is made by the feeder arrangement setting unit.

In this aspect, the operator is able to carry out tape feeder pre-arrangement work, referring to the arrangement setting information displayed by the display unit.

A component-mounting system according to another aspect of the present disclosure includes a component-mounting device having a component feeding unit in which a plurality of tape feeders are arranged in a row; and the above feeder management device that manages arrangement of the plurality of tape feeders in the component feeding unit.

This component-mounting system includes the feeder management device that in a state in which various first tape feeders different in shape and in method of supplying the component storage tape are present together, manages tape feeder arrangement that allows the operator to smoothly carry out pre-arrangement work and component supply work. As a result, a case where component feeding from the tape feeders stops due to a delay in pre-arrangement work and component supply work can be prevented. Hence, a drop in the efficiency of production of the component-mounting board can be prevented.

As described above, the present disclosure provides the feeder management device that in a state in which various first tape feeders different in shape and in method of supplying the component storage tape are present together, manages tape feeder arrangement that allows the operator to smoothly carry out pre-arrangement work and component supply work, and the component-mounting system including the feeder management device.

What is claimed is:

1. A feeder management device that manages an arrangement of a plurality of tape feeders in a component feeding unit of a component mounting device that mounts components on a board to produce a component-mounting board,
the plurality of tape feeders being arranged in a row in the component feeding unit, the tape feeders are configured to deliver components being carried on a component storage tape to feed the components, the feeder management device further comprising:
a feeder classifier configured to classify the plurality of tape feeders as one of a plurality of types of tape feeders, the plurality of tape feeders are classified according to a classification index that is based on a shape or on a method of supplying the component storage tape;
an input unit that receives input of an instruction to set an arrangement of the plurality of tape feeders; and a feeder arrangement setting unit that, based on the instruction input to the input unit, is configured to arrange the plurality of tape feeders based on the classification of the tape feeders made by the feeder classifier, the feeder arrangement setting unit includes: a first setting unit that is configured to extract a tape feeder that has been classified as a special type feeder by the feeder classifier, and arrange the plurality of tape feeders such that a given reference number or more of the special type feeders are arranged consecutively in a row in an area of the component feeding unit, the area being defined by at least both ends of the component feeding unit in a direction of the row.

2. The feeder management device according to claim 1, wherein the input unit is configured to receive an instruction that specifies the given reference number.

3. The feeder management device according claim 2, wherein the input unit is configured to receive a third arrangement specifying instruction that takes into account an efficiency of production of the component-mounting board by the component-mounting device, and the feeder arrangement setting unit includes a third setting unit that is configured to arrange the plurality of tape feeders, based on the third arrangement specifying instruction.

4. The feeder management device according to claim 2, further comprising a display configured to display arrangement setting information that indicates the tape feeder arrangement setting made by the feeder arrangement setting unit.

5. The feeder management device according claim 1, wherein the input unit is configured to receive a third arrangement specifying instruction that takes into account an efficiency of production of the component-mounting board by the component-mounting device, and the feeder arrangement setting unit includes a third setting unit that is configured to arrange the plurality of tape feeders, based on the third arrangement specifying instruction.

6. The feeder management device according to claim 1, further comprising a display configured to display arrangement setting information that indicates the tape feeder arrangement setting made by the feeder arrangement setting unit.

7. The feeder management device according to claim 1, wherein the feeder classifier is configured:

to use a longitudinal length of a taper feeder along a direction of the component storage tape as the classification index according to shape, and to classify the plurality of tape feeders into tape feeders having a first longitudinal length, and tape feeders having a second longitudinal length shorter than the first longitudinal length;

the input is configured to receive a first arrangement specifying instruction that takes into account a shape of the tape feeders, and when the first arrangement specifying instruction is input to the input unit, the first setting unit extracts the tape feeders having the second longitudinal length, the tape feeders having the second longitudinal length are classified by the feeder classifier as the special type feeders.

8. The feeder management device according claim 7, wherein the input unit is configured to receive a third arrangement specifying instruction that takes into account an efficiency of production of the component-mounting board by the component-mounting device, and the feeder arrangement setting unit includes a third setting unit that is configured to arrange the plurality of tape feeders, based on the third arrangement specifying instruction.

9. The feeder management device according to claim 7, further comprising a display configured to display arrangement setting information that indicates the tape feeder arrangement setting made by the feeder arrangement setting unit.

10. The feeder management device according to claim 7, wherein the plurality of tape feeders includes:

at least one tape feeder that adopts a first supply method, wherein the tape feeder can be fitted with a plurality of component storage tapes that include: a preceding component storage tape that feeds components first, and a component storage tape for replenishment that feeds components subsequently; and at least one feeder that adopts a second supply method, wherein the component storage tape for replenishment is spliced to a rear end of the preceding component storage tape.

11. The feeder management device according claim 10, wherein the input unit is configured to receive a third arrangement specifying instruction that takes into account an efficiency of production of the component-mounting board by the component-mounting device, and the feeder arrangement setting unit includes a third setting unit that is configured to arrange the plurality of tape feeders, based on the third arrangement specifying instruction.

12. The feeder management device according to claim 10, wherein the longitudinal length of the at least one of the tape feeders adopting the second supply method is determined to be shorter than the longitudinal length of the at least one of the tape feeders adopting the first supply method, and when a method of supplying the component storage tape is used as the classification index, the feeder classifier is configured to:

classify the at least one of the tape feeders adopting the first supply method as tape feeders having the first longitudinal length, and classify the at least one of the tape feeders adopting the second supply method as tape feeders having the second longitudinal length.

13. The feeder management device according to claim 12, wherein the input unit is configured to receive a second arrangement specifying instruction that takes into account the method of supplying the component storage tape to one of the tape feeders, the feeder arrangement setting unit includes a second setting unit that is configured to set an arrangement of the plurality of tape feeders, based on the second arrangement specifying instruction, and the second setting unit is configured to: specify a setting target area in which the arrangement of the plurality of tape feeders is located, segment the setting target area into a plurality of areas, and arrange the tape feeders adopting the first supply method or the tape feeders adopting the second supply method consecutively in a row in one segmented area.

14. The feeder management device according to claim 13, further comprising:
a plurality of production lines for the component-mounting board, the production lines each including a plurality of the component-mounting devices having component feeding units arranged in a direction of transferring the board, the component feeding units are arranged in the setting target area; wherein
the second setting unit is further configured to segment the setting target area that defines one of:
a partial area of the component feeding unit, or an entire area that includes the component feeding unit, the component-mounting device, and the production line, as one segmented area.

15. The feeder management device according to claim 14, wherein
the second arrangement specifying instruction includes an instruction that adds intensive arrangement specifying information, the intensive arrangement specifying information is for intensively arranging the tape feeders adopting the first supply method on an upstream side in the direction of transferring the board, and
when the second arrangement specifying instruction that includes the intensive arrangement specifying information is input to the input unit, the second setting unit arranges the tape feeders adopting the first supply method in a row in the component feeding unit of the component-mounting device located on the upstream side in the direction of transferring the board in the setting target area.

16. The feeder management device according to claim 14, wherein
the second arrangement specifying instruction includes an instruction that adds feeder type specifying information, the feeder type specifying information specifies, for each segmented area, either the tape feeders adopting the first supply method, or the tape feeders adopting the second supply method, as tape feeders to be arranged in a row, and
when the second arrangement specifying instruction that includes the feeder type specifying information is input to the input unit, the second setting unit arranges, in a row in each segmented area, the tape feeders that adopt the first supply method, or the tape feeders that adopt the second supply method, based on the feeder type specifying information.

17. The feeder management device according to claim 10, further comprising a display configured to display arrangement setting information that indicates the tape feeder arrangement setting made by the feeder arrangement setting unit.

18. A component-mounting system comprising:
a component-mounting device having a component feeding unit in which a plurality of tape feeders are arranged in a row, the tape feeders are configured to deliver components being carried on a component storage tape to feed the components; and
a feeder management device that manages arrangement of the plurality of tape feeders in the component feeding unit,
the feeder management device comprising:
a feeder classifier configured to classify the plurality of tape feeders as one of a plurality of types of tape feeders, the plurality of tape feeders are classified according to a classification index that is based on a shape or on a method of supplying the component storage tape;
an input unit that receives input of an instruction to set an arrangement of the plurality of tape feeders; and
a feeder arrangement setting unit that, based on the instruction input to the input unit, is configured to arrange the plurality of tape feeders based on the classification of the tape feeders made by the feeder classifier,
the feeder arrangement setting unit includes: a first setting unit that is configured to extract a tape feeder that has been classified as a special type feeder by the feeder classifier, and arrange the plurality of tape feeders such that a given reference number or more of the special type feeders are arranged consecutively in a row in an area of the component feeding unit, the area being defined by at least both ends of the component feeding unit in a direction of the row.

19. A component-mounting system comprising:
a component-mounting device having a component feeding unit in which a plurality of tape feeders are arranged in a row, the tape feeders are configured to deliver components being carried on a component storage tape to feed the components; and
a feeder management device that manages arrangement of the plurality of tape feeders in the component feeding unit,
the feeder management device comprising:
a feeder classifier configured to classify the plurality of tape feeders as one of a plurality of types of tape feeders, the plurality of tape feeders are classified according to a classification index that is based on a shape or on a method of supplying the component storage tape;
an input unit that receives input of an instruction to set an arrangement of the plurality of tape feeders; and
a feeder arrangement setting unit that, based on the instruction input to the input unit, is configured to arrange the plurality of tape feeders based on the classification of the tape feeders made by the feeder classifier,
the feeder arrangement setting unit includes: a first setting unit that is configured to extract a tape feeder that has been classified as a special type feeder by the feeder classifier, and arrange the plurality of tape feeders such that a given reference number or more of the special type feeders are arranged consecutively in a row in an area of the component feeding unit, the area being defined by at least both ends of the component feeding unit in a direction of the row, and
the input unit is configured to receive an instruction that specifies the given reference number.

20. A component-mounting system comprising:
a component-mounting device having a component feeding unit in which a plurality of tape feeders are arranged in a row, the tape feeders are configured to deliver components being carried on a component storage tape to feed the components; and
a feeder management device that manages arrangement of the plurality of tape feeders in the component feeding unit,
the feeder management device comprising:
a feeder classifier configured to classify the plurality of tape feeders as one of a plurality of types of tape feeders, the plurality of tape feeders are classified according to a classification index that is based on a shape or on a method of supplying the component storage tape;

an input unit that receives input of an instruction to set an arrangement of the plurality of tape feeders; and a feeder arrangement setting unit that, based on the instruction input to the input unit, is configured to arrange the plurality of tape feeders based on the classification of the tape feeders made by the feeder classifier, the feeder arrangement setting unit includes: a first setting unit that is configured to extract a tape feeder that has been classified as a special type feeder by the feeder classifier, and arrange the plurality of tape feeders such that a given reference number or more of the special type feeders are arranged consecutively in a row in an area of the component feeding unit, the area being defined by at least both ends of the component feeding unit in a direction of the row, and the feeder classifier is configured:

to use a longitudinal length of a taper feeder along a direction of the component storage tape as the classification index according to shape, and to classify the plurality of tape feeders into tape feeders having a first longitudinal length, and tape feeders having a second longitudinal length shorter than the first longitudinal length;

the input is configured to receive a first arrangement specifying instruction that takes into account a shape of the tape feeders, and when the first arrangement specifying instruction is input to the input unit, the first setting unit extracts the tape feeders having the second longitudinal length, the tape feeders having the second longitudinal length are classified by the feeder classifier as the special type feeders.

* * * * *